(12) United States Patent
Jung et al.

(10) Patent No.: US 10,224,087 B1
(45) Date of Patent: Mar. 5, 2019

(54) SENSING VOLTAGE BASED ON A SUPPLY VOLTAGE APPLIED TO MAGNETO-RESISTIVE RANDOM ACCESS MEMORY (MRAM) BIT CELLS IN AN MRAM FOR TRACKING WRITE OPERATIONS TO THE MRAM BIT CELLS

(71) Applicants: Qualcomm Technologies, Inc., San Diego, CA (US); Yonsei University, University-Industry Foundation, Seoul (KR)

(72) Inventors: Seong-Ook Jung, Seoul (KR); Sara Choi, Seoul (KR); Hong Keun Ahn, Seoul (KR); Seung Hyuk Kang, San Diego, CA (US); Sungryul Kim, San Diego, CA (US)

(73) Assignees: Qualcomm Technologies, Incorporated, San Diego, CA (US); Yonsei University, University Industry Foundation, Seoul (KR)

( * ) Notice: Subject to any disclaimer, the term of this patent is extended or adjusted under 35 U.S.C. 154(b) by 0 days.

(21) Appl. No.: 15/849,863

(22) Filed: Dec. 21, 2017

(51) Int. Cl.
*G11C 11/00* (2006.01)
*G11C 11/16* (2006.01)
(Continued)

(52) U.S. Cl.
CPC ........ *G11C 11/1673* (2013.01); *G11C 11/161* (2013.01); *G11C 11/1675* (2013.01);
(Continued)

(58) Field of Classification Search
CPC ............ G11C 11/1673; G11C 11/1675; G11C 11/161; H01L 43/08; H01L 27/228; H01L 43/02
(Continued)

(56) References Cited

U.S. PATENT DOCUMENTS 7,006,373 B2 * 2/2006 Hidaka .................... G11C 11/15
 365/148
7,116,598 B2 * 10/2006 Shimizu ................ G11C 7/062
 365/210.1

(Continued)

OTHER PUBLICATIONS

Bi, Xiuyuan et al., "Probabilistic design methodology to improve run-time stability and performance of STT-RAM caches," in 2012 IEEE/ACM International Conference on Computer-Aided Design (ICCAD), 2012, pp. 88-94.

(Continued)

*Primary Examiner* — Tha-O H Bui
(74) *Attorney, Agent, or Firm* — W&T/Qualcomm

(57) ABSTRACT

Sensing voltage based on a supplied to magneto-resistive random access memory (MRAM) bit cells in an MRAM for tracking write operations. Sensing voltage based on supply voltage applied to an MRAM bit cell in a write operation can be used to detect completion of magnetic tunnel junction (MTJ) switching in an MRAM bit cell to terminate the write operation to reduce power and write times. In exemplary aspects provided herein, reference and write operation voltages sensed from the MRAM bit cell in response to the write operation are compared to each other to detect completion of MTJ switching of voltage based on the supply voltage applied to the MRAM bit cell regardless of whether the write operation is logic '0' or logic '1' write operation. This provides a higher sensing margin, because the change in MTJ resistance after MTJ switching completion is larger at the supply voltage rail.

37 Claims, 13 Drawing Sheets

(51) Int. Cl.
*H01L 27/22* (2006.01)
*H01L 43/02* (2006.01)
*H01L 43/08* (2006.01)

(52) U.S. Cl.
CPC ............ *H01L 27/228* (2013.01); *H01L 43/02* (2013.01); *H01L 43/08* (2013.01)

(58) Field of Classification Search
USPC ........................................................ 365/158
See application file for complete search history.

(56) References Cited

U.S. PATENT DOCUMENTS

| | | | |
|---|---|---|---|
| 7,388,788 B2 * | 6/2008 | Honda | G11C 7/14 365/185.2 |
| 9,520,173 B1 | 12/2016 | Baker, Jr. et al. | |
| 2003/0218901 A1 | 11/2003 | Ooishi et al. | |
| 2011/0080773 A1 | 4/2011 | El Baraji et al. | |
| 2014/0347919 A1 | 11/2014 | Aoki | |
| 2015/0364178 A1 | 12/2015 | Kim et al. | |

OTHER PUBLICATIONS

Farkhani, Hooman et al., "STT-RAM Energy Reduction Using Self-Referenced Differential Write Termination Technique," IEEE Transactions on Very Large Scale Integration (VLSI) Systems, vol. 25, No. 2, Feb. 2017, pp. 476-487.

Imani, Mohsen et al., "Low power data-aware STT-RAM based hybrid cache architecture," in 2016 17th International Symposium on Quality Electronic Design (ISQED), 2016, pp. 88-94.

Park, Jaeyoung et al., "Variation-Tolerant Write Completion Circuit for Variable-Energy Write STT-RAM Architecture," IEEE Transactions on Very Large Scale Integration (VLSI) Systems, vol. 24, No. 4, Apr. 2016, pp. 1351-1360.

Wang, Jue et al., "OAP: An obstruction-aware cache management policy for STT-RAM last-level caches," Design, Automation & Test in Europe Conference & Exhibition, Jan. 2013, pp. 847-852.

Zhang, Li et al., "A 16 Kb Spin-Transfer Torque Random Access Memory With Self-Enable Switching and Precharge Sensing Schemes," IEEE Transactions on Magnetics, vol. 50, No. 4, Apr. 2014, pp. 1-7.

* cited by examiner

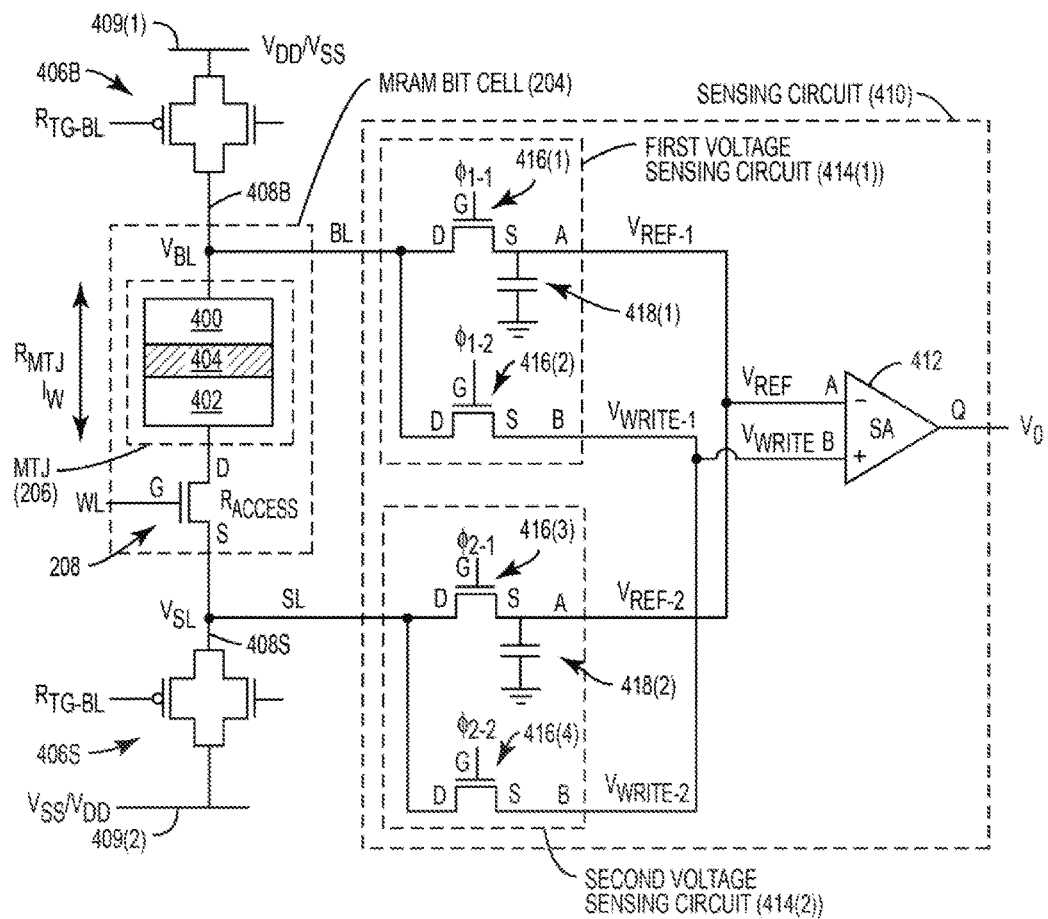
*FIG. 4*
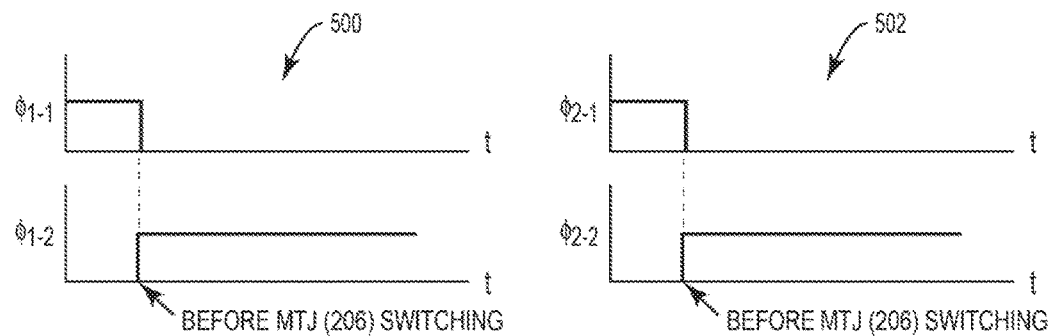
*FIG. 5A*  *FIG. 5B*

SENSING VOLTAGE BASED ON A SUPPLY VOLTAGE APPLIED TO MAGNETO-RESISTIVE RANDOM ACCESS MEMORY (MRAM) BIT CELLS IN AN MRAM FOR TRACKING WRITE OPERATIONS TO THE MRAM BIT CELLS

BACKGROUND

I. Field of the Disclosure

The technology of the disclosure relates generally to magneto-resistive random access memory (MRAM) comprised of MRAM bit cells that include magnetic tunnel junctions (MTJs) for storing memory states as a function of programmed magnetic orientations, and more particularly to write operations to MRAM bit cells.

II. Background

Semiconductor storage devices are used in integrated circuits (ICs) in electronic devices to provide data storage. One example of a semiconductor storage device is static random access memory (SRAM). Conventional SRAM-based cache is very fast, but it has low density and expensive costs. To resolve the disadvantage of SRAM cache, magneto-resistive random access memory (MRAM) can be employed in memory to provide data storage. MRAM is non-volatile memory in which data is stored by programming a magnetic tunnel junction (MTJ) as part of an MRAM bit cell. One advantage of MRAM is that MTJs in MRAM bit cells can retain stored information even when power is turned off. This is because data is stored in the MTJ as a small magnetic element rather than as an electric charge or current. MRAM has high density characteristics and non-volatile features, which can be used in computer cache memory designs.

In this regard, an MTJ comprises a free ferromagnetic layer ("free layer") disposed above or below a fixed or pinned ferromagnetic layer ("pinned layer"). The free and pinned layers are separated by a tunnel junction or barrier formed by a thin non-magnetic dielectric layer. The magnetic orientation of the free layer can be changed, but the magnetic orientation of the pinned layer remains fixed or "pinned." Data can be stored in the MTJ according to the magnetic orientation between the free layer and the pinned layer. When the magnetic orientations of the free and pinned layers are anti-parallel (AP) to each other, a first memory state exists (e.g., a logical '1'). When the magnetic orientations of the free and pinned layers are parallel (P) to each other, a second memory state exists (e.g., a logical '0'). The magnetic orientations of the free and pinned layers can be sensed to read data stored in the MTJ by sensing a resistance when current flows through the MTJ. Data can also be written to and stored in the MTJ by applying a magnetic field to change the magnetic orientation of the free layer to either a P or AP magnetic orientation with respect to the pinned layer.

Recent developments in MTJ devices involve spin-torque-transfer (STT)-MRAM devices. In STT-MRAM devices, the spin polarization of carrier electrons, rather than a pulse of a magnetic field, is used to program the state stored in the MTJ (i.e., a '0' or a '1'). In this regard, FIG. 1 illustrates an exemplary MRAM bit cell 100 that includes a metal-oxide semiconductor (typically n-type MOS, i.e., NMOS) access transistor 102 integrated with an MTJ 104 for storing non-volatile data. The MRAM bit cell 100 may be provided in an MRAM memory used as memory storage for any type of system requiring electronic memory, such as a central processing unit (CPU) or processor-based system, as examples. The MTJ 104 includes a pinned layer 106 and a free layer 108 disposed on either side of a tunnel barrier 110 formed by a thin non-magnetic dielectric layer. When the magnetic orientation of the pinned and free layers 106, 108 are anti-parallel (AP) to each other, a first memory state exists (e.g., a logical '1'). When the magnetic orientation of the pinned and free layers 106, 108 are parallel (P) to each other, a second memory state exists (e.g., a logical '0'). Further, the access transistor 102 controls reading and writing data to the MTJ 104. A drain (D) of the access transistor 102 is coupled to a bottom electrode 112 of the MTJ 104, which is coupled to the pinned layer 106. A word line 114 is coupled to a gate (G) of the access transistor 102. A source (S) of the access transistor 102 is coupled to a source line 116, which is coupled to a write driver circuit 118. A bit line 120 is coupled to the write driver circuit 118 and a top electrode 122 of the MTJ 104, which is coupled to the free layer 108.

With continuing reference to FIG. 1, to read data from the MRAM bit cell 100, a voltage differential is applied between the source line 116 and the bit line 120. The gate G of the access transistor 102 is activated by activating the word line 114 to create a circuit with the write driver circuit 118 to cause a read current $I_R$ to flow through the MTJ 104. The voltage is applied between the source line 116 and the bit line 120 such that the direction of the read current $I_R$ flows from the free layer 108 to the pinned layer 106. The read current $I_R$ is sensed as an indication of the resistance of the MTJ 104 indicating whether the free layer 108 is a P or AP magnetic orientation to the pinned layer 106, and hence whether the MTJ 104 stores a logic '0' or '1' value. When writing data to the MTJ 104, a larger voltage differential is applied between the source line 116 and the bit line 120 by the write driver circuit 118, and the gate G of the access transistor 102 is activated by activating the word line 114. This causes a write current $I_W$ larger than the read current $I_R$ to flow through the MTJ 104. The write current $I_W$ must be strong enough to change the magnetic orientation of the free layer 108. If the magnetic orientation is to be changed from an AP to P magnetic orientation, the write current $I_W$ flowing from the top electrode 122 to the bottom electrode 112 induces STT at the free layer 108 that can change the magnetic orientation of the free layer 108 to P with respect to the pinned layer 106. If the magnetic orientation is to be changed from P to AP, a current flowing from the bottom electrode 112 to the top electrode 122 induces an STT at the free layer 108 to change the magnetic orientation of the free layer 108 to AP with respect to the pinned layer 106.

Thus, as discussed above, a feature of STT-MRAM is that it is a non-volatile memory that can retain stored data (i.e., magnetization state) without power. A lower current level is needed to read the data stored in the MTJ in an MRAM bit cell to avoid changing the magnetic orientation of the free layer in the MTJ. However, in write operations that write data in an MRAM bit cell, a higher level of current is required to change the magnetic orientation of the free layer in the MTJ. Thus, STT-MRAM requires larger dynamic energy during write operations than read operations. Even though the number of write operations performed to MRAM bit cells in an MRAM may be much lower than the number of read operations, the dynamic energy consumption of write operations is still significant enough to consume more power than may be desired for low power memory applications.

SUMMARY OF THE DISCLOSURE

Aspects disclosed in the detailed description include sensing voltage based on a supply voltage applied to magneto-resistive random access memory (MRAM) bit cells in an MRAM for tracking write operations to the MRAM bit cells. Once the magnetic tunnel junction (MTJ) switching in an MRAM bit cell has completed in response to a write operation, the resistance of the MTJ will change since the resistance of the MTJ is a function of the magnetic orientation of a free layer in the MTJ. Thus, sensing voltage based on the supply voltage applied to the MRAM bit cell in a write operation can be used to detect when the switching of an MTJ in the MRAM bit cell is completed. In this regard, in exemplary aspects disclosed herein, a first voltage sensing circuit and second voltage sensing circuit are provided for each MRAM bit cell. The first and second voltage sensing circuits are each configured to provide a reference voltage based on the supply voltage and a write operation voltage in response to a write operation to an MRAM bit cell to be compared to sense the completion of the MTJ switching in the MRAM bit cell. The first voltage sensing circuit is configured to be coupled to a first voltage rail of an MRAM bit cell (e.g., bit line or source line), and a second voltage sensing circuit is configured to be coupled to the second voltage rail of the MRAM bit cell (e.g., source line or bit line). In a pre-charge phase for a write operation, either the first or second voltage sensing circuit, depending on the logic of the write operation, is controlled to sense and store a reference voltage based on the supply voltage applied to the MRAM bit cell. Then, in a write operation phase for the write operation, the same first or second voltage sensing circuit is controlled to sense the voltage of the MRAM bit cell in the write operation to detect completion of MTJ switching. Then, the same first or second voltage sensing circuit is configured to provide the stored reference voltage based on the supply voltage and the write operation voltage to be compared to determine a change in voltage indicating completion of MTJ switching. For example, a sense amplifier can be employed to sense a change in voltage at the supply voltage rail as compared to a reference voltage to sense the completion of the write operation. This sensed completion of MTJ switching in an MRAM bit cell can then be used to terminate the write operation to the MRAM bit cell to reduce dynamic power consumption and average write times.

Thus, in exemplary aspects disclosed herein, only the voltage sensing circuit among the first and second voltage sensing circuits that is coupled to a voltage rail (i.e., a respective bit line or source line) of an MRAM bit cell is activated in response to a write operation to sense the reference voltage based on the supply voltage (i.e., a positive voltage) in a pre-charge phase and the write operation voltage in a write operation phase for the write operation to the MRAM bit cell. For example, the bit line of the MRAM bit cell may receive a voltage based on the supply voltage for a logic '0' write operation, but the source line of the MRAM bit cell may receive a voltage based on the supply voltage for a logic '1' write operation. For example, for a logic '0' write operation, the positive write voltage would be applied to the bit line to provide for the write current to flow in a first direction to change the magnetization state of the free layer of the MTJ to a parallel (P) magnetic orientation. However, in a logic '1' write operation, the source line may receive the voltage based on the supply voltage to provide for the write current to flow in a second, opposite direction to change the magnetization state of the free layer of the MTJ to an anti-parallel (AP) magnetic orientation. By only one of the first and second voltage sensing circuits being coupled to a respective bit line or source line of an MRAM bit cell that receives a voltage based on the supply voltage from the supply voltage rail for a write operation, the reference and write operation voltages compared to detect completion of MTJ switching are the voltages applied to the supply voltage rail of the MRAM bit cell. This provides a higher sensing margin for sensing completion of MTJ switching in the MRAM bit cell, because the change in resistance in the MTJ after completion of MTJ switching is larger at the supply voltage rail among the first and second power rails. This is opposed to, for example, providing the reference voltage and the write operation voltage in a write operation of the MRAM bit cell from the same voltage rail for both logic '0' and logic '1' write operations. Providing the reference voltage and the write operation voltage from the same voltage rail regardless of whether the voltage rail is the supply voltage rail for both logic '0' and logic I' write operations, reduces a voltage margin between the reference voltage and the write operation voltage, and thus reduces sensing margin. This is because the change in resistance in the MTJ after completion of MTJ switching is larger at the supply voltage rail than the other, non-supply voltage rail.

In this regard in one aspect, a sensing circuit for sensing MTJ switching in an MRAM bit cell in response to a write operation is provided. The sensing circuit comprises a sense amplifier. The sense amplifier comprises a first voltage input configured to be coupled to a reference voltage, a second voltage input configured to be coupled to a write operation voltage, and a voltage output. The sense amplifier is configured to generate an output voltage based on a difference between the reference voltage and the write operation voltage. The sensing circuit also comprises at least one storage circuit coupled to the first voltage input and the second voltage input. The sensing circuit also comprises a first voltage sensing circuit. The first voltage sensing circuit comprises a first control circuit coupled to the first voltage input. The first control circuit is configured to couple a bit line to the at least one storage circuit to pre-charge the at least one storage circuit to a first reference voltage based on a supply voltage applied to the bit line in response to a first pre-charge signal indicating a pre-charge phase. The first voltage sensing circuit also comprises a second control circuit coupled to the second voltage input. The second control circuit is configured to couple the second voltage input to the bit line to apply a first write operation voltage based on the supply voltage applied on the bit line to the second voltage input in response to a first write operation signal indicating a write operation phase in response to a first write operation to an MRAM bit cell of a first logic state. The sensing circuit also comprises a second voltage sensing circuit. The second voltage sensing circuit comprises a third control circuit coupled to the first voltage input. The third control circuit is configured to couple a source line to the at least one storage circuit to pre-charge the at least one storage circuit to a second reference voltage based on the supply voltage applied to the source line in response to a second pre-charge signal indicating a pre-charge phase. The second voltage sensing circuit also comprises a fourth control circuit coupled to the second voltage input. The fourth control circuit is configured to couple the second voltage input to the source line to apply a second write operation voltage based on the supply voltage applied on the source line to the second voltage input in response to a second write operation signal indicating a write operation phase in response to a second write operation to the MRAM bit cell of a second logic state opposite the first logic state.

In another aspect, a sensing circuit for sensing MTJ switching in an MRAM bit cell in response to a write operation is provided. The sensing circuit comprises a sensing means for generating an output voltage based on a difference between a reference voltage and a write operation voltage. The sensing circuit also comprises a storage means coupled to the sensing means. The sensing circuit also comprises a first sensing means for pre-charging the storage means to a first reference voltage based on a supply voltage applied to a bit line coupled to an MRAM bit cell in response to a first pre-charge signal indicating a pre-charge phase in response to a first write operation, and for discharging the first reference voltage stored in the storage means to the sensing means in response to the first pre-charge signal not indicating a pre-charge phase. The sensing circuit also comprises a second sensing means for coupling the sensing means to the bit line to apply a first write operation voltage on the bit line to the sensing means in response to a first write operation signal indicating a write operation phase in response to the first write operation to the MRAM bit cell of a first logic state. The sensing circuit also comprises a third sensing means for pre-charging the storage means to a second reference voltage based on a supply voltage applied to a source line coupled to the MRAM bit cell in response to a second pre-charge signal indicating a pre-charge phase in response to a second write operation, and for discharging the second reference voltage stored in the storage means to the sensing means in response to the first pre-charge signal not indicating a pre-charge phase. The sensing circuit also comprises a fourth sensing means for coupling the sensing means to the source line to apply a second write operation voltage on the source line to the sensing means in response to a second write operation signal indicating a write operation phase in response to the second write operation to the MRAM bit cell of a second logic state opposite the first logic state.

In another aspect, a method of sensing MTJ switching in an MRAM bit cell in response to a write operation is provided. The method comprises coupling a bit line to a first storage circuit, in response to a first pre-charge signal indicating a pre-charge phase, to pre-charge the first storage circuit to a first reference voltage based on a supply voltage applied to the bit line of an MRAM bit cell. The method also comprises coupling the first reference voltage stored in the first storage circuit to a first voltage input coupled to a sense amplifier. The method also comprises coupling a first write operation voltage on the bit line to a second voltage input coupled to the sense amplifier, in response to a first write operation signal indicating a write operation phase to switch a magnetic orientation of an MTJ of the MRAM bit cell to a first logic state for a first write operation. The method also comprises sensing a difference in the first reference voltage at the first voltage input and the first write operation voltage at the second voltage input to detect switching of the magnetic orientation of the MTJ of the MRAM bit cell in response to the first write operation. The method also comprises coupling a source line to a second storage circuit, in response to a second pre-charge signal indicating a pre-charge phase, to pre-charge the second storage circuit to a second reference voltage based on a supply voltage applied to the source line. The method also comprises coupling the second reference voltage stored in the second storage circuit to the first voltage input coupled to the sense amplifier. The method also comprises coupling a second write operation voltage on the source line to the second voltage input coupled to the sense amplifier, in response to a second write operation signal indicating a write operation phase to switch the magnetic orientation of the MTJ of the MRAM bit cell to a second logic state, opposite of the first logic state, for a second write operation. The method also comprises sensing a difference in the second reference voltage at the first voltage input and the second write operation voltage at the second voltage input to detect switching of the magnetic orientation of the MTJ of the MRAM bit cell in response to the second write operation.

In another aspect, an MRAM is provided. The MRAM comprises a plurality of MRAM bit cells each comprising an access transistor comprising a gate node coupled to a word line, a first access node and a second access node coupled to a source line, and an MTJ coupled between a bit line and the first access node of the access transistor. The MRAM also comprises a plurality of sensing circuits each coupled to an MRAM bit cell among the plurality of MRAM bit cells. Each sensing circuit among the plurality of sensing circuits comprises at least one storage circuit, a first voltage sensing circuit, and a second voltage sensing circuit. The first voltage sensing circuit comprises a first control circuit coupled to a first voltage input. The first control circuit is configured to couple a bit line to the at least one storage circuit to pre-charge the at least one storage circuit to a first reference voltage based on a supply voltage applied to the bit line in response to a first pre-charge signal indicating a pre-charge phase. The first voltage sensing circuit also comprises a second control circuit coupled to a second voltage input. The second control circuit is configured to couple the second voltage input to the bit line to apply a first write operation voltage based on the supply voltage applied on the bit line to the second voltage input in response to a first write operation signal indicating a write operation phase in response to a first write operation to the MRAM bit cell of a first logic state. The second voltage circuit comprises a third control circuit coupled to the first voltage input. The third control circuit is configured to couple the source line to the at least one storage circuit to pre-charge the at least one storage circuit to a second reference voltage based on the supply voltage applied to the source line in response to a second pre-charge signal indicating a pre-charge phase. The second voltage circuit also comprises a fourth control circuit coupled to the second voltage input. The fourth control circuit is configured to couple the second voltage input to the source line to apply a second write operation voltage based on the supply voltage applied to the source line to the second voltage input in response to a second write operation signal indicating a write operation phase in response to a second write operation to the MRAM bit cell of a second logic state opposite the first logic state.

BRIEF DESCRIPTION OF THE FIGURES

FIG. 4 is a schematic diagram of an exemplary MRAM bit cell in the MRAM array in FIG. 3 and a sensing circuit coupled to the MRAM bit cell, wherein the sensing circuit is configured to sense a reference voltage applied to a supply voltage rail in a pre-charge phase and sense a write operation voltage applied to the supply voltage rail in a write operation phase, to detect MTJ switching in the MRAM bit cell;

FIGS. 5A and 5B are timing diagrams illustrating exemplary timing of a pre-charge phase signal that controls a pre-charge phase of the sensing circuit in FIG. 4 and a write operation signal that controls the write operation phase of the sensing circuit in FIG. 4;

DETAILED DESCRIPTION

Figure 1:
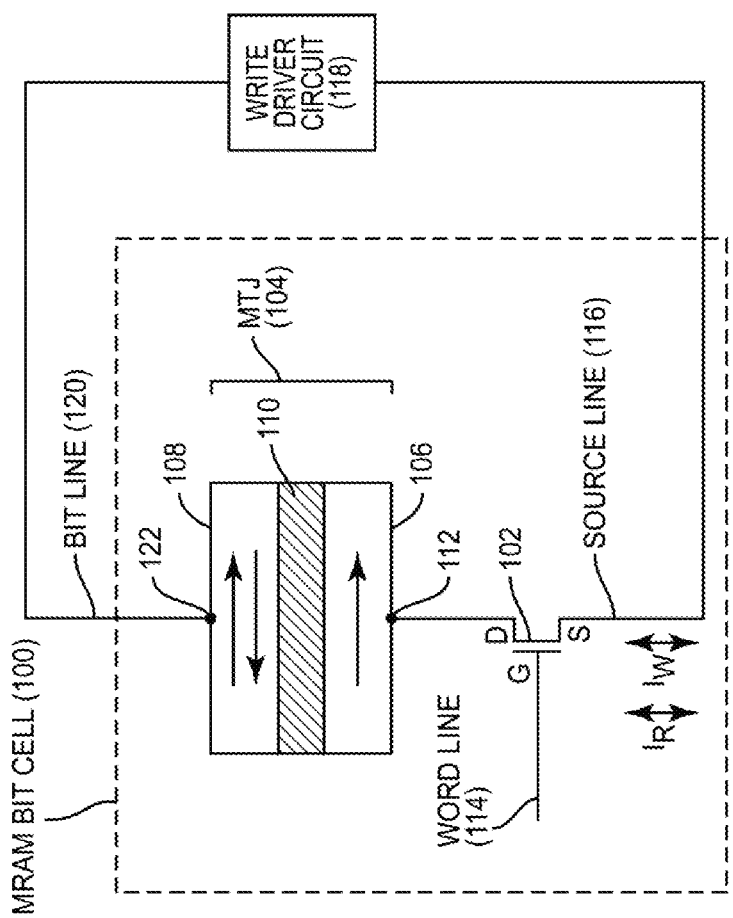
FIG. 1 is a diagram of an exemplary magnetic random access memory (MRAM) bit cell employing a magnetic tunnel junction (MTJ)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include sensing voltage based on a supply voltage applied to magneto-resistive random access memory (MRAM) bit cells in an MRAM for tracking write operations to the MRAM bit cells. Once the magnetic tunnel junction (MTJ) switching in an MRAM bit cell has completed in response to a write operation, the resistance of the MTJ will change since the resistance of the MTJ is a function of the magnetic orientation of a free layer in the MTJ. Thus, sensing voltage based on the supply voltage applied to the MRAM bit cell in a write operation can be used to detect when the switching of an MTJ in the MRAM bit cell is completed. In this regard, in exemplary aspects disclosed herein, a first voltage sensing circuit and second voltage sensing circuit are provided for each MRAM bit cell. The first and second voltage sensing circuits are each configured to provide a reference voltage based on the supply voltage and a write operation voltage in response to a write operation to an MRAM bit cell to be compared to sense the completion of the MTJ switching in the MRAM bit cell. The first voltage sensing circuit is configured to be coupled to a first voltage rail of an MRAM bit cell (e.g., bit line or source line), and a second voltage sensing circuit is configured to be coupled to the second voltage rail of the MRAM bit cell (e.g., source line or bit line). In a pre-charge phase for a write operation, either the first or second voltage sensing circuit, depending on the logic of the write operation, is controlled to sense and store a reference voltage based on the supply voltage applied to the MRAM bit cell. Then, in a write operation phase for the write operation, the same first or second voltage sensing circuit is controlled to sense the voltage of the MRAM bit cell in the write operation to detect completion of MTJ switching. Then, the same first or second voltage sensing circuit is configured to provide the stored reference voltage based on the supply voltage and the write operation voltage to be compared to determine a change in voltage indicating completion of MTJ switching. For example, a sense amplifier can be employed to sense a change in voltage at the supply voltage rail as compared to a reference voltage to sense the completion of the write operation. This sensed completion of MTJ switching in an MRAM bit cell can then be used to terminate the write operation to the MRAM bit cell to reduce dynamic power consumption and average write times.

Thus, in exemplary aspects disclosed herein, only the voltage sensing circuit among the first and second voltage sensing circuits that is coupled to a voltage rail (i.e., a respective bit line or source line) of an MRAM bit cell is activated in response to a write operation to sense the reference voltage based on the supply voltage (i.e., a positive voltage) in a pre-charge phase and the write operation voltage in a write operation phase for the write operation to the MRAM bit cell. For example, the bit line of the MRAM bit cell may receive a voltage based on the supply voltage for a logic '0' write operation, but the source line of the MRAM bit cell may receive a voltage based on the supply voltage for a logic '1' write operation. For example, for a logic '0' write operation, the positive write voltage would be applied to the bit line to provide for the write current to flow in a first direction to change the magnetization state of the free layer of the MTJ to a parallel (P) magnetic orientation. However, in a logic '1' write operation, the source line may receive the voltage based on the supply voltage to provide for the write current to flow in a second, opposite direction to change the magnetization state of the free layer of the MTJ to an anti-parallel (AP) magnetic orientation. By only one of the first and second voltage sensing circuits being coupled to a respective bit line or source line of an MRAM bit cell that receives a voltage based on the supply voltage from the supply voltage rail for a write operation, the reference and write operation voltages compared to detect completion of MTJ switching are the voltages applied to the supply voltage rail of the MRAM bit cell. This provides a higher sensing margin for sensing completion of MTJ switching in the MRAM bit cell, because the change in resistance in the MTJ after completion of MTJ switching is larger at the supply voltage rail among the first and second power rails. This is opposed to, for example, providing the reference voltage and the write operation voltage in a write operation of the MRAM bit cell from the same voltage rail for both logic '0' and logic '1' write operations. Providing the reference voltage and the write operation voltage from the same voltage rail regardless of whether the voltage rail is the supply voltage rail for both logic '0' and logic '1' write operations, reduces a voltage margin between the reference voltage and the write operation voltage, and thus reduces sensing margin. This is because the change in resistance in the MTJ after completion of MTJ switching is larger at the supply voltage rail than the other, non-supply voltage rail.

Figure 2:
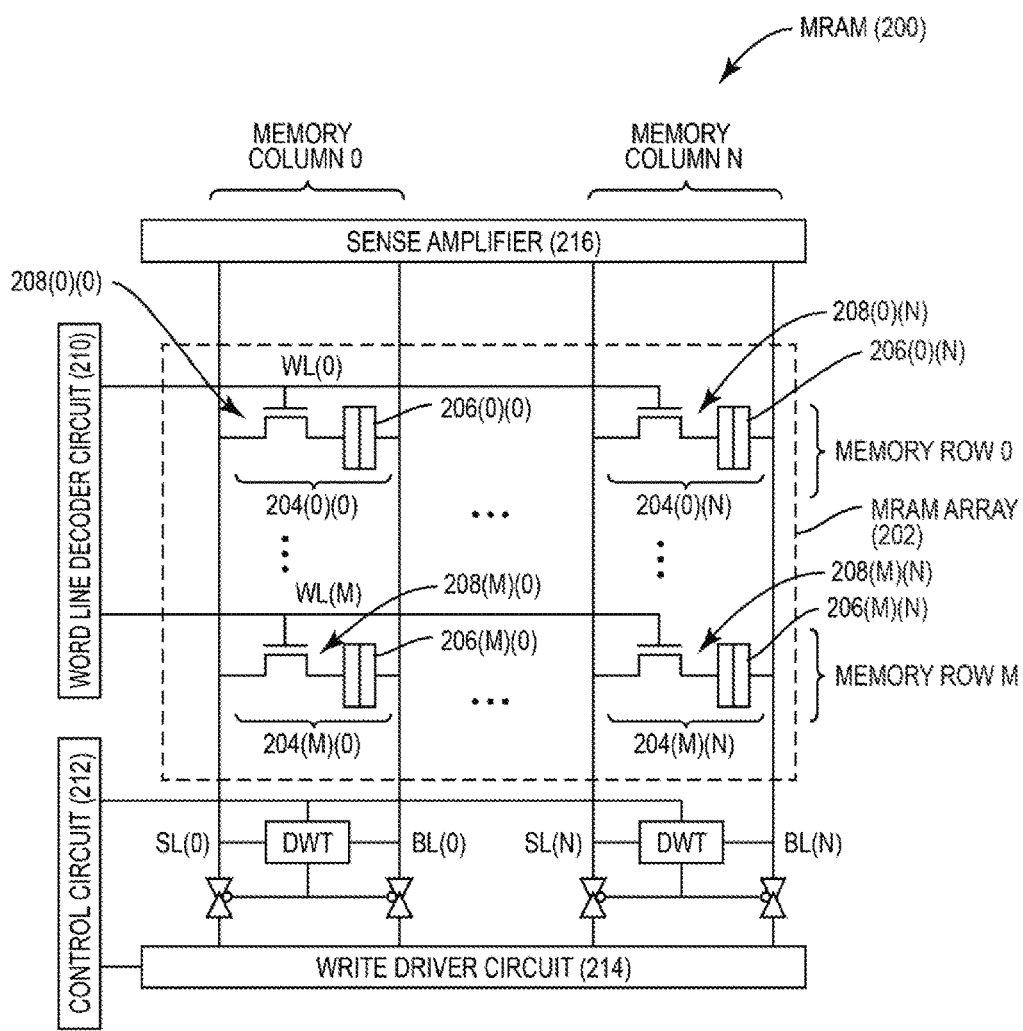
FIG. 2 is a schematic diagram of an exemplary MRAM that includes an MRAM array comprising a plurality of MRAM bit cells organized in row and columns and supporting access circuitry for accessing the MRAM bit cells, and further including a sensing circuit coupled to each MRAM bit cell for sensing and comparing a reference voltage and write operation voltage to detect MTJ switching in the MRAM bit cell.

In this regard, FIG. 2 illustrates an exemplary MRAM 200 that includes an MRAM array 202 that includes a plurality of MRAM bit cells 204(0)(0)-204(M)(N) organized in memory rows 0-M and memory columns 0-N. In this example, each MRAM bit cell 204(0)(0)-204(M)(N) includes an MTJ 206(0)(0)-206(M)(N) coupled to an access transistor 208(0)(0)-208(M)(N). The access transistors 208(0)(0)-208(M)(N) for each MRAM bit cell 204(0)(0)-204(M)(N) are coupled to respective word lines WL(0)-WL(M) that are associated with a respective memory row 0-M. A word line decoder circuit 210 is provided in the MRAM 200 and configured to decode a memory address for a memory read or write operation to assert a word line signal on the word line WL(0)-WL(M) associated with the memory row 0-M of the memory address to activate the MRAM bit cells 204(0)(0)-204(M)(N) in the selected memory row 0-M for the write operation. When a memory row 0-M of the MRAM bit cell 204(0)0-204(M)( ) is selected by the word line decoder circuit 210, the MTJs 206(0)0-206(M)( ) of MRAM bit cells 204(0)0-204(M)( ) in the selected memory row 0-M are coupled between a respective source line SL(0)-SL(N) and a bit line BL(0)-BL(N) in the memory columns 0-N.

With continuing reference to FIG. 2, for a write operation, a control circuit 212 controls a write driver circuit 214 based on the memory access being a write operation to assert a write voltage differential between the source lines SL(0)-SL(N) and their corresponding bit lines BL(0)-BL(N) according to the memory state to be written to the respective MTJs 2060(0)-2060(N) in the selected memory row 0-M. This causes a respective write current to flow through the respective MTJs 2060(0)-2060(N) in the selected memory row 0-M between the respective source lines SL(0)-SL(N) and bit lines BL(0)-BL(N) to switch the magnetic orientation (i.e., direction) of the free layers to store the memory state to be written according to the write operation. The magnetic orientation of the free layers can be switched to be parallel (P) or anti-parallel (AP) to the magnetic orientation of the pinned layers of respective MTJs 2060(0)-2060(N) to represent logic '0' and '1', respectively. The polarity of a write differential voltage between the respective source lines SL(0)-SL(N) and bit lines BL(0)-BL(N) controls the direction of the write current and whether the respective MTJs 2060(0)-2060(N) in the selected memory row 0-M are switched to a P or AP memory state. As will be discussed in more detail below, the voltage at either the source lines SL(0)-SL(N) or bit lines BL(0)-BL(N) of the selected MRAM bit cells 204(0)(0)-204(M)(N) in the MRAM 200 that is supplied by a supply voltage rail can be sensed for tracking write operations to the MRAM bit cells 204(0)(0)-204(M)(N) to in turn cause the write driver circuit 214 to de-assert or discontinue applying the write voltage differential between the source lines SL(0)-SL(N) and their corresponding bit lines BL(0)-BL(N) for the write operation to reduce dynamic power consumption and average write times.

For a read operation, the sense amplifier 216 asserts a read voltage differential between the source lines SL(0)-SL(N) and their corresponding bit lines BL(0)-BL(N) of the respective MTJs 2060(0)-2060(N) in the selected memory row 0-M to be read. This causes a respective read current to flow through the respective MTJs 2060(0)-2060(N) in the selected memory row 0-M between the respective source lines SL(0)-SL(N) and bit lines BL(0)-BL(N) according to the resistance of the respective MTJs 2060(0)-2060(N), which is dependent on magnetic orientation (i.e., direction) of the free layers therein representing a stored memory state. The read voltage differential is less than the write voltage differential so that a read current is not generated that is able to switch the magnetic orientation of the free layers of the MTJs 2060(0)-2060(N) in the selected memory row 0-M. A sense amplifier 216 senses the read current as a way to determine the resistance of the respective MTJs 2060(0)-2060(N) in the selected memory row 0-M for the read operation, and thus the memory state stored in the MTJs 2060(0)-2060(N).

Figure 3:
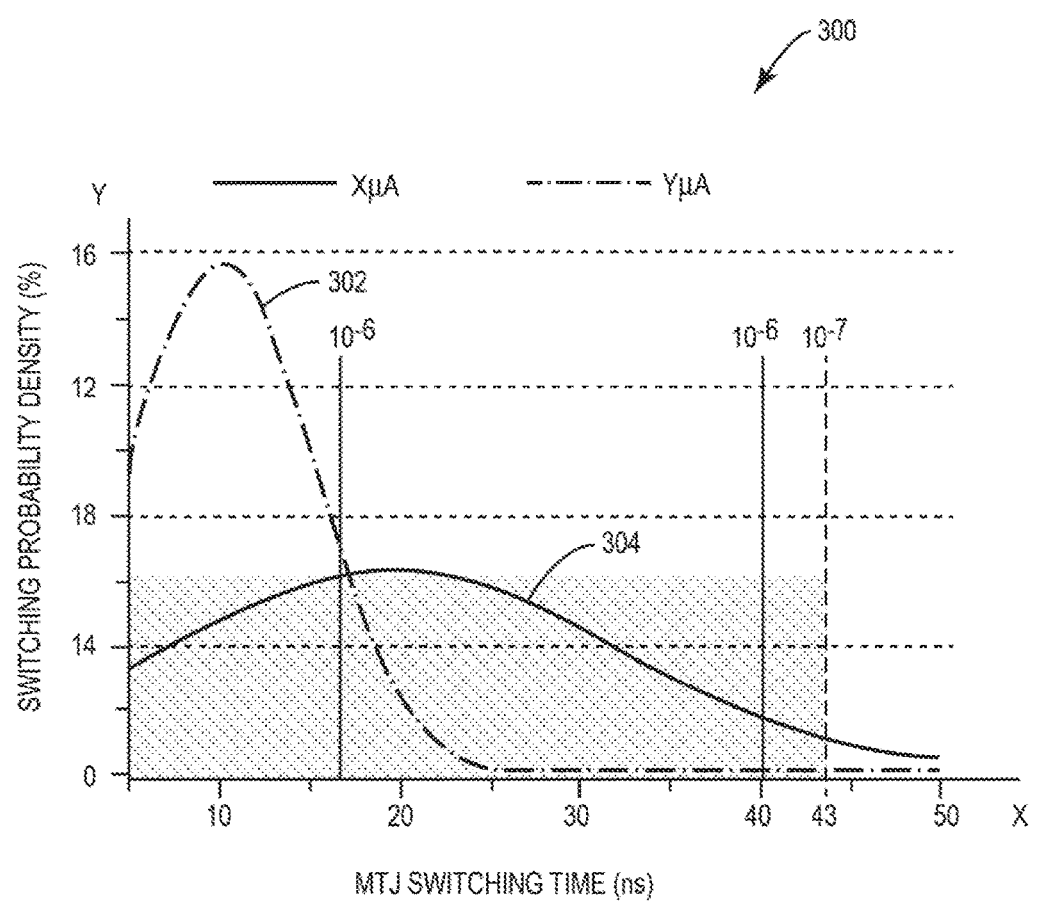
FIG. 3 is a graph illustrating an exemplary MTJ switching time distribution of an exemplary MTJ in the MRAM bit cell in the MRAM in FIG. 2 for a write operation.

FIG. 3 is a graph 300 illustrating an exemplary switching time distribution of the MTJs 206(0)(0)-206(M)(N) in the MRAM bit cell 204(0)(0)-204(M)(N) in the MRAM 200 in FIG. 2 for a write operation. As shown therein, the X-axis plots the MTJ switching time in nanoseconds (ns). The Y-axis plots the switching probability density percentage (%) for a given MTJ switching time. As shown therein, the MTJ switching time is not the same for a given MTJ 206(0)(0)-206(M)(N), but rather the MTJ switching time is a probability distribution. For example, curve 302 shows the MTJ switching time distribution for a write current of X microAmps ($\mu$A), and curve 304 shows the MTJ switching time distribution for a write current of Y microAmps ($\mu$A), which is less than X $\mu$A. Thus, to achieve a worst case write failure probability of $10^{-7}$, meaning that the failure rate of switching of the magnetic orientation of the MTJs 206(0)(0)-206(M)(N) is $10^{-7}$, the write time in this example must be at least 43 ns. However, most write operations to the MTJs 206(0)(0)-206(M)(N) can switch the magnetic orientation of the MTJs 206(0)(0)-206(M)(N) in less than 43 ns. Thus, if the write driver circuit 214 in the MRAM 200 in FIG. 2 is configured for a write time of 43 ns in this example to achieve a failure rate of $10^{-7}$, additional write time is required and additional power will be consumed for most write operations where the magnetic orientation of written MTJs 206(0)(0)-206(M)(N) are switched in less than 43 ns for a write operation. If a write operation can be terminated right after the switching of the magnetic orientation of written MTJs 206(0)(0)-206(M)(N), average write time and energy consumption can be reduced.

In aspects disclosed herein and as discussed in more detail below, to detect the end of a write operation to selected MRAM bit cells 204(0)(0)-204(M)(N) for the write operation, the voltage based on a supply voltage at supply voltage rail applied to the source lines SL(0)-SL(N) or the bit lines BL(0)-BL(N) of the written MRAM bit cells 204(0)(0)-204(M)(N) in the MRAM 200 in FIG. 2 is sensed to track write operations to the MRAM bit cells 204(0)(0)-204(M)(N). The end of a write operation to the written MRAM bit cells 204(0)(0)-204(M)(N) is detected by sensing the voltage at the source lines SL(0)-SL(N) or bit lines BL(0)-BL(N) as a method of determining the change in resistance of the written MRAM bit cells 204(0)(0)-204(M)(N). As will be discussed in more detail below, either the source lines SL(0)-SL(N) or the bit lines BL(0)-BL(N) are sensed based on whichever receives a voltage based on a supply voltage that is a positive voltage with respect to the voltage at the opposite, respective bit lines BL(0)-BL(N) or source lines SL(0)-SL(N). This provides a higher sensing margin for sensing completion of MTJ 206 switching in an MRAM bit cell 204, because the change in resistance in the MTJ 206 after completion of MTJ 206 switching is larger at whichever of the source lines SL(0)-SL(N) or bit lines BL(0)-BL(N) receive the voltage based on the supply voltage. This is opposed to, for example, comparing the reference voltage and the write operation voltage in a write operation of the MRAM bit cell 204 from either the source lines SL(0)-SL(N) or the bit lines BL(0)-BL(N) for both logic '0' and logic '1' write operations even if a voltage applied to the source lines SL(0)-SL(N) or the bit lines BL(0)-BL(N) is not based on the supply voltage. Sensing the reference voltage and the write operation voltage from the same voltage rail regardless of whether a voltage is applied to the voltage rail based on the supply voltage rail for both logic '0' and logic '1' write operations, reduces the voltage margin between the reference voltage and the write operation voltage, and thus reduces sensing margin. This is because the change in resistance in the written MTJ 206(0)(0)-206(M)(N) after switching completion is larger at a voltage rail that has a positive voltage applied based on the supply voltage than a voltage rail that has a negative voltage applied. A change in resistance occurs in the MRAM bit cells 204(0)(0)-204(M)(N) after the magnetic orientation of their respective MTJs 206(0)(0)-206(M)(N) switch magnetic orientation. The resistance of a written MTJ 206(0)(0)-206(M)(N) will change since the resistance of the MTJ 206(0)(0)-206(M)(N) is a function of the magnetic orientation of the free layer in the MTJ 206(0)(0)-206(M)(N). Thus, sensing voltage at either the source lines SL(0)-SL(N) or the bit lines BL(0)-BL(N) that receive a voltage based on the supply voltage for a written MRAM bit cell 204(0)(0)-204(M)(N) can be used to detect when the write operation is completed. As an example, the detected completion of a write operation to MRAM bit cells 204(0)(0)-204(M)(N) can then be used to terminate the write operation to reduce dynamic power consumption and average write times.

In this regard, FIG. 4 is a schematic diagram of an exemplary MRAM bit cell 204 that can be included in the MRAM array 202 in the MRAM 200 in FIG. 2. The MRAM bit cell 204 includes an MTJ 206. The MTJ 206 in this example includes a free layer 400 and a pinned layer 402 separated by a dielectric tunnel barrier 404. The free layer 400 can be a ferromagnetic material whose magnetic moment (i.e., magnetic orientation) can be changed by a write current $I_W$ flowing through the MRAM bit cell 204. The pinned layer 402 can be a ferromagnetic material whose magnetic moment (i.e., magnetic orientation) is pinned or fixed and thus is not affected by the write current $I_W$ flowing through the MRAM bit cell 204. The tunnel barrier 404 is a dielectric material, such as magnesium oxide (MgO) for example, to provide a tunnel magneto-resistance (TMR). A first node as the drain node D of an access transistor 208 is coupled to the MTJ 206, and to the pinned layer 402 (or through an electrode coupled to the pinned layer 402) in this particular example. However, note that the pinned layer 402 and free layer 400 could be reversed as shown in FIG. 4 and the access transistor 208 coupled to the free layer 400 (or through an electrode coupled to the free layer 400). Also in this example, a second node as the source node S of the access transistor 208 is coupled to a source line SL. A gate node G of the access transistor 208 is coupled to a word line WL. The access transistor 208 is shown in FIG. 4 as an N-type metal-oxide semiconductor (NMOS) transistor, but could be provided as a P-type MOS (PMOS) transistor as another example. Bit line and source line pass gates 406B, 406S are provided and coupled to the respective bit line BL and source line SL to control application of a voltage applied to respective bit line and source line voltage rails 408B, 408S coupled to the MRAM bit cell 204.

To write a logic '0' to the MRAM bit cell 204 in this example, a voltage is applied on the word line WL and the gate node G sufficient to activate the access transistor 208. The bit line and source line pass gates 406B, 406S are activated to provide a current path between the bit line BL and the source line SL. A supply voltage $V_{DD}$ on a first voltage rail 409(1) sources a bit line voltage $V_{BL}$ applied to the bit line voltage rail 408B, and voltage $V_{SS}$ on a second voltage rail 409(2) sources a source line voltage $V_{SL}$ applied to the source line voltage rail 408S as a negative or return voltage rail. Thus, the bit line voltage $V_{BL}$ at the bit line voltage rail 408B is a positive voltage with respect to the source line voltage $V_{SL}$ at the source line voltage rail 408S. The positive bit line voltage $V_{BL}$ applied to the bit line voltage rail 408B causes the write current $I_W$ to flow from the bit line BL to the source line SL. The supply voltage $V_{DD}$ is high enough to cause the bit line voltage $V_{BL}$ to be large enough to generate a large enough write current $I_W$ to cause the magnetic orientation of the free layer 400 of the MTJ 206 of the MRAM bit cell 204 to switch to a P magnetic orientation with respect to the pinned layer 402 in this example. On the other hand, to write a logic '1' to the MRAM bit cell 204, the access transistor 208 is again activated, and the bit line and source line pass gates 406B, 406S are activated. However in this case, the supply voltage $V_{DD}$ is applied to the second voltage rail 409(2) to source the source line voltage $V_{SL}$ at the source line voltage rail 408S instead of the bit line voltage rail 408B to apply a positive supply voltage on the source line voltage rail 408S with respect to the bit line voltage rail 408B. The bit line voltage rail 408B has a negative voltage based on the negative supply voltage $V_{SS}$ as the negative or return voltage rail. The source line voltage $V_{SL}$ on the source line voltage rail 408S causes the write current $I_W$ to flow from the source line SL to the bit line BL. The supply voltage $V_{DD}$ is applied to cause the positive source line voltage $V_{SL}$ to be large enough to generate a large enough write current $I_W$ to switch the magnetic orientation of the free layer 400 of the MTJ 206 of the MRAM bit cell 204 to an AP magnetic orientation with respect to the pinned layer 402 in this example.

With continuing reference to FIG. 4, a sensing circuit 410 is provided to sense the voltage at either the source line SL or the bit line BL (depending on the logic of the write operation) to track write operations to the MRAM bit cell 204. The sensed voltage at the source line SL or the bit line BL, depending on the logic of the write operation, can be used to detect the end of a write operation to the MRAM bit cell 204. In this regard, the sensing circuit 410 may be provided for each MRAM bit cell 204(0)(0)-204(M)(N) in the MRAM array 202 in FIG. 2 as one example. In another example, a plurality of sensing circuits 410 may be provided for each memory column 0-N in the MRAM array 202 in FIG. 2, where the sensing circuits 410 are configured to sense voltage at the supply voltage rail of the MRAM bit cells 204(0)0-2040(N) in a selected memory row 0-M to be written. To sense the bit line voltage $V_{BL}$ or source line voltage $V_{SL}$ at the bit line BL or source line SL, respectively, applied to the MRAM bit cell 204 in response to a write operation to detect the MTJ 206 switching therein, the sensing circuit 410 includes a sense amplifier 412. The sense amplifier 412 has a first voltage input A configured to be coupled to a reference voltage $V_{REF}$. The sensing circuit 410 is configured to provide the bit line voltage $V_{BL}$ or the source line voltage $V_{SL}$ applied to the MRAM bit cell 204 based on the supply voltage $V_{DD}$ as a reference voltage $V_{REF}$ in a pre-charge phase of the write operation as opposed to a fixed reference voltage for example. This accounts for process and environmental variations in the MRAM bit cell 204. The sense amplifier 412 has a second voltage input B configured to be coupled to a write operation voltage $V_{WRITE}$. After the pre-charge phase of the write operation, the sensing circuit 410 is configured to couple the source line voltage $V_{SL}$ or the bit line voltage $V_{BL}$ at the respective source line SL or bit line BL applied to the MRAM bit cell 204 as the write operation voltage $V_{WRITE}$ to second voltage input B of the sense amplifier 412. The sense amplifier 412 also has a voltage output Q. The sense amplifier 412 is configured to generate an output voltage $V_O$ on the voltage output Q based on a difference between the reference voltage $V_{REF}$ and the write operation voltage $V_{WRITE}$. Thus, the sense amplifier 412 can compare the bit line voltage $V_{BL}$ or the source line voltage $V_{SL}$, depending on the logic of the write operation, as the reference voltage $V_{REF}$ before the magnetic orientation of the MTJ 206 is switched, to the bit line voltage $V_{BL}$ or the source line voltage $V_{SL}$ as the write operation voltage $V_{WRITE}$ after the magnetic orientation of the MTJ 206 is switched to detect when the MTJ 206 has switched. As discussed above, a resistance $R_{MTJ}$ of the MTJ 206 will change after its magnetic orientation is switched, which can be detected as a change in the write operation voltage $V_{WRITE}$ for the write operation. To accomplish this functionality, as will be discussed below, the sensing circuit 410 is configured to control the coupling of either the bit line voltage $V_{BL}$ at the bit line BL or the source line voltage $V_{SL}$ at the source line SL, respectively as the reference voltage $V_{REF}$ for the write operation voltage $V_{WRITE}$ coupled to the sense amplifier 412 before and after magnetic orientation of the MTJ 206 is switched.

It is desired for the sensing circuit 410 to be configured to couple reference voltages $V_{REF}$ and write operation voltages $V_{WRITE}$ from either the bit line BL or the source line SL based on the logic of the write operation to increase sensing margin. As discussed above, for a logic '0' write operation, the supply voltage $V_{DD}$ is applied to the first voltage rail 409(1) to apply a positive voltage to the bit line BL. However, for a logic '1' write operation, the supply voltage $V_{DD}$ is applied to the second voltage rail 409(2) to apply a positive voltage to the source line SL. The reason for this is because the change in MTJ 206 resistance $R_{MTJ}$ after switching the magnetic orientation of the MTJ 206 is larger at the voltage rail that has the supply voltage $V_{DD}$ among the bit line voltage rail 408B and the source line voltage rail 408S than the other voltage rail among the bit line voltage rail 408B and the source line voltage rail 408S having a negative voltage. This is shown in formulas (1)-(4) below.

$R_{MTJ}$ is the resistance of the MTJ 206. $R_{ACCESS}$ is the resistance of the access transistor 208. $R_{TG-SL}$ is the resistance of the source line pass gate 406S. $R_{TG-BL}$ is the resistance of the bit line pass gate 406B. In this regard, formulas (1) and (2) show the bit line voltage $V_{BL}$ and source line voltage $V_{SL}$ for a logic '0' write operation. Formulas (3) and (4) show the bit line voltage $V_{BL}$ and source line voltage $V_{SL}$ for a logic '1' write operation. For a logic '0' write operation, the MTJ 206 resistance $R_{MTJ}$ of the MTJ 206 is decreased. As shown below in formulas (1) and (2) of the bit line voltage $V_{BL}$ and source line voltage $V_{SL}$ respectively for a logic '0' write operation, since the effect of this decrease in MTJ 206 resistance $R_{MTJ}$ is higher in the numerator than in the denominator of equation (1), the bit line voltage $V_{BL}$ decreases. However, the source line voltage $V_{SL}$ increases since the MTJ 206 resistance $R_{MTJ}$ in the denominator of equation (2) decreases. Thus, sensing the bit line voltage $V_{BL}$ as the supply voltage rail for a logic '0' write operation results in a greater sensing margin for the sense amplifier 412 than sensing the source line voltage $V_{SL}$.

$$V_{BL} = \frac{R_{MTJ} + R_{ACCESS} + R_{TG-SL}}{R_{TG-SL} + R_{MTJ} + R_{ACCESS} + R_{TG-BL}} V_{DD} \quad (1)$$

$$V_{SL} = \frac{R_{TG-SL}}{R_{TG-SL} + R_{MTJ} + R_{access} + R_{TG-BL}} V_{DD} \quad (2)$$

On the other hand, for a logic '1' write operation, the MTJ 206 resistance $R_{MTJ}$ is increased. As shown below in formulas (3) and (4) of the bit line voltage $V_{BL}$ and source line voltage $V_{SL}$ respectively for a logic '1' write operation, since the effect of this increase in MTJ 206 resistance $R_{MTJ}$ is higher in the numerator than in the denominator of equation (4), the source line voltage $V_{SL}$ increases. However, the bit line voltage $V_{BL}$ decreases since the MTJ 206 resistance $R_{MTJ}$ in the denominator of equation (3) increases. Thus, sensing the source line voltage $V_{SL}$ as the supply voltage rail for a logic '1' write operation results in a greater sensing margin for the sense amplifier 412 than sensing the bit line voltage $V_{BL}$.

$$V_{BL} = \frac{R_{TG-BL}}{R_{TG-SL} + R_{MTJ} + R_{ACCESS} + R_{TG-BL}} V_{DD} \quad (3)$$

$$V_{SL} = \frac{R_{ACCESS} + R_{MTJ} + R_{TG-BL}}{R_{TG-SL} + R_{MTJ} + R_{ACCESS} + R_{TG-BL}} V_{DD} \quad (4)$$

Figure 6:
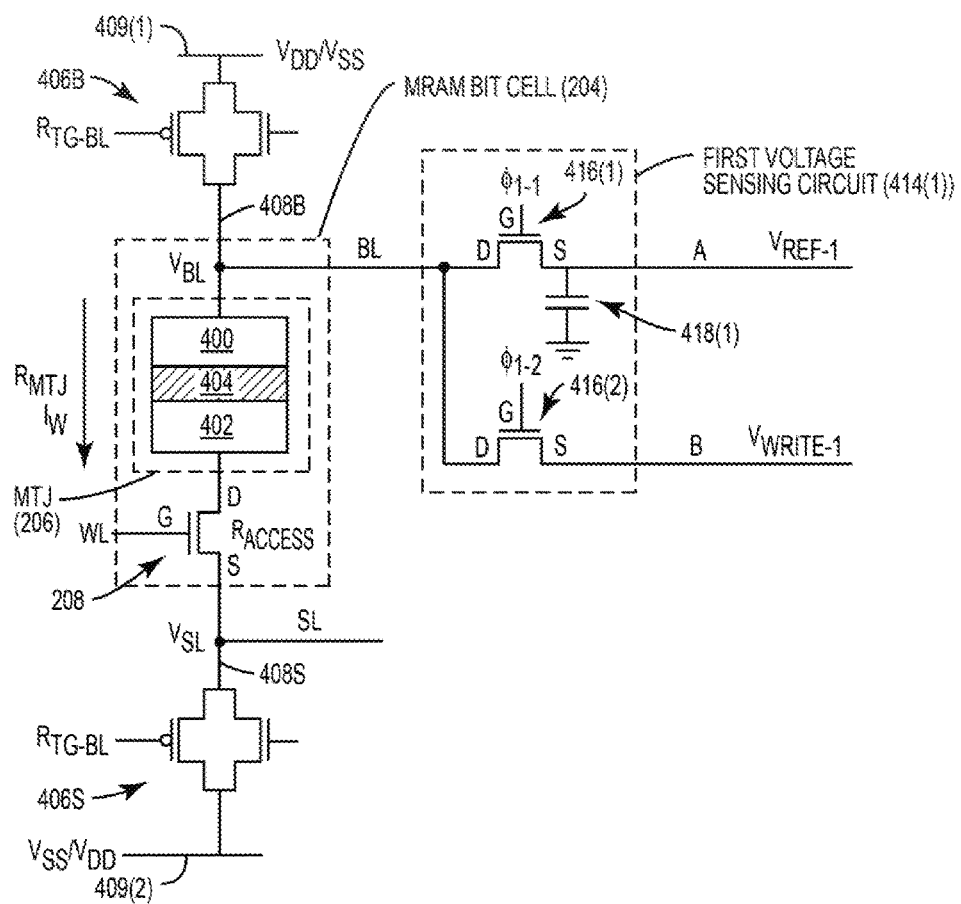
FIG. 6 is a diagram illustrating an exemplary logic '0' write operation to an MRAM bit cell in the MRAM in FIG. 2.

In this regard, the sensing circuit 410 in FIG. 4 is configured to be able to couple either the bit line voltage rail 408B or the source line voltage rail 408S, depending on the logic of the write operation, to increase sensing margin. For the sensing circuit 410 to be able to couple to the bit line BL for performing a sensing operation when performing a logic '0' write operation, a first voltage sensing circuit 414(1) is provided. The first voltage sensing circuit 414(1) in this example includes a first control circuit 416(1) and a second control circuit 416(2). In this example, the first control circuit 416(1) and the second control circuit 416(2) are NMOS transistors. A drain node D of the first control circuit 416(1) is coupled to the bit line BL, and a source node S of the first control circuit 416(1) is coupled to the first voltage input A. Thus, the first control circuit 416(1) is coupled to and between the first voltage input A of the sense amplifier 412, and the bit line BL coupled to the MRAM bit cell 204. This is also shown in FIG. 6 illustrating the MRAM bit cell 204 undergoing a logic '0' write operation. The first control circuit 416(1) is configured to couple the bit line BL to a first storage circuit 418(1) to pre-charge the first storage circuit 418(1) to a first reference voltage $V_{REF-1}$ as the bit line voltage $V_{BL}$ on the bit line BL. The first storage circuit 418(1) can be a capacitor as an example. The first control circuit 416(1) couples the bit line BL to the first storage circuit 418(1) to pre-charge the first storage circuit 418(1) to the bit line voltage $V_{BL}$ in response to a first pre-charge signal $\Phi_{1-1}$ indicating a first pre-charge phase for a write operation, as shown for example in timing diagram 500 in FIG. 5A. In this example, the first pre-charge signal $\Phi_{1-1}$ is coupled to the gate G of the first control circuit 416(1), and is an active high signal since the first control circuit 416(1) in this example is an NMOS transistor. The first voltage sensing circuit 414(1) also includes the second control circuit 416(2), which is also an NMOS transistor in this example. A drain node D of the second control circuit 416(2) is coupled to the bit line BL, and a source node S of the second control circuit 416(2) is coupled to the second voltage input B. Thus, the second control circuit 416(2) is coupled to and between the second voltage input B of the sense amplifier 412, and the bit line BL coupled to the MRAM bit cell 204, and as also shown in FIG. 6 illustrating the MRAM bit cell 204 undergoing a logic '0' write operation. The second control circuit 416(2) is configured to couple the bit line BL to the second voltage input B of the sense amplifier 412 to couple a first write operation voltage $V_{WRITE-1}$ as the bit line voltage $V_{BL}$ on the bit line BL based on a supply voltage $V_{DD}$ applied to the bit line BL in response to a first write operation signal $\Phi_{1-2}$ indicating a first write operation phase. In this example, the first write operation signal $\Phi_{1-2}$ is coupled to the gate G of the second control circuit 416(2), and is an active high signal since the second control circuit 416(2) in this example is an NMOS transistor, as shown in FIG. 5A.

As shown in FIG. 5A, the first pre-charge signal $\Phi_{1-1}$ and the first write operation signal $\Phi_{1-2}$ are controlled to be active at different times. Thus, the first voltage sensing circuit 414(1) is controlled to couple to the bit line voltage $V_{BL}$ with the supply voltage $V_{DD}$ applied at different times to apply the first reference voltage $V_{REF-1}$ and the first write operation voltage $V_{WRITE-1}$ to voltage inputs A and B of the sense amplifier 412 to be compared. In this regard, the first control circuit 416(1) of the first voltage sensing circuit 414(1) couples the bit line voltage $V_{BL}$ applied to the bit line BL as a result of the supply voltage $V_{DD}$ applied to the first voltage rail 409(1) as the first reference voltage $V_{REF-1}$ to the first storage circuit 418(1) to be stored in the pre-charge phase of the write operation, as shown by the first pre-charge signal $\Phi_{1-1}$ being active high in FIG. 5A. Then, during the write operation phase of the write operation, the first pre-charge signal $\Phi_{1-1}$ is controlled to be active low to deactivate the first control circuit 416(1) with the first reference voltage $V_{REF-1}$ stored in the first storage circuit 418(1). The first write operation signal $\Phi_{1-2}$ is controlled to be active high to activate the second control circuit 416(2) to couple the bit line voltage $V_{BL}$ as the first write operation voltage $V_{WRITE-1}$ to the second voltage input B of the sense amplifier 412, as shown by the first write operation signal $\Phi_{1-2}$ being active high in FIG. 5A. Thus, the first reference voltage $V_{REF-1}$ that was applied to the bit line BL as the bit line voltage $V_{BL}$ during the pre-charge phase of the write operation and the first write operation voltage $V_{WRITE-1}$ applied on the bit line BL during the write operation phase of the write operation are applied to the first and second voltage inputs A and B of the sense amplifier 412. The sense amplifier 412 is enabled based on the first write operation signal $\Phi_{1-2}$ to sense the difference in voltage between the first reference voltage $V_{REF-1}$, as a base line voltage, stored in the first storage circuit 416(1) at the first voltage input A, and the first write operation voltage $V_{WRITE-1}$ at the second voltage input B. The sense amplifier 412 generates the output voltage $V_O$ on the voltage output Q based on a detected difference between the first reference voltage $V_{REF-1}$ and the first write operation voltage $V_{WRITE-1}$. The detected difference in the first reference voltage $V_{REF-1}$ and the first write operation voltage $V_{WRITE-1}$ can be used to detect when the magnetic orientation of the MTJ 206 has switched for a logic '0' write operation. A difference in voltage between the first reference voltage $V_{REF-1}$, as a base line voltage, and the first write operation voltage $V_{WRITE-1}$ will occur when the magnetic orientation of the MTJ 206 switches because of the change in MTJ 206 resistance $R_{MTJ}$ of the MTJ 206 after switching.

Figure 7:
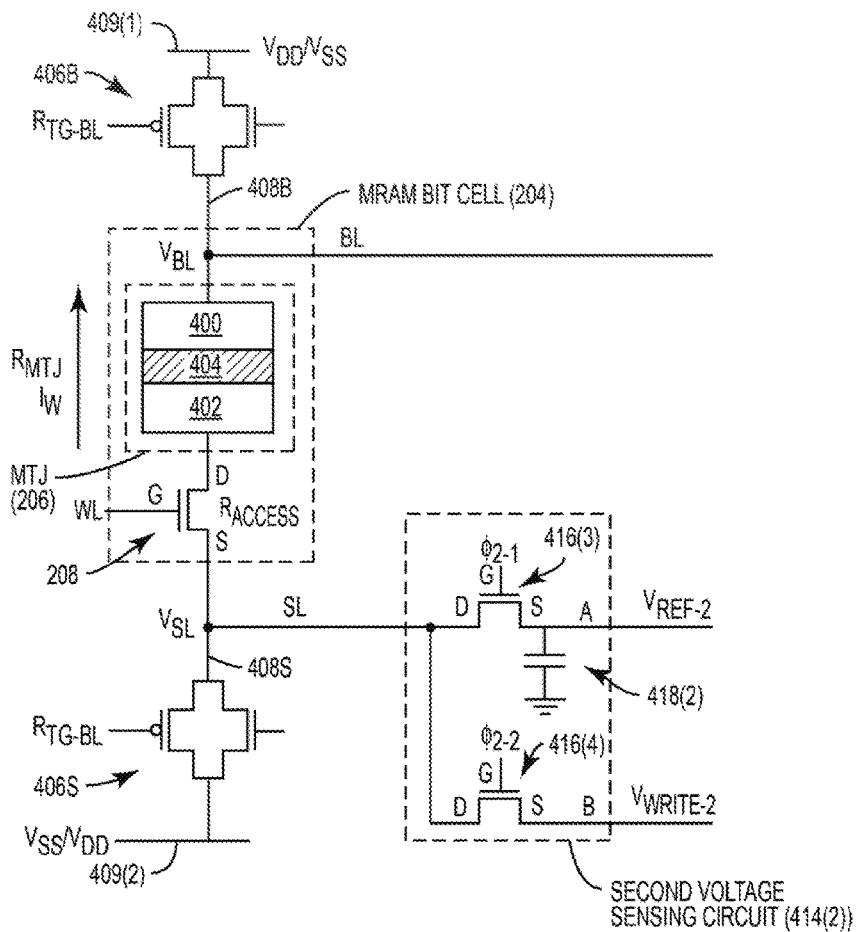
FIG. 7 is a diagram illustrating an exemplary logic '1' write operation to an MRAM bit cell in the MRAM in FIG. 2.

For the sensing circuit 410 to be able to couple to the source line SL for performing a sensing operation when performing a logic '1' write operation, the sensing circuit 410 also includes a second voltage sensing circuit 414(2). The second voltage sensing circuit 414(2) includes a third control circuit 416(3) and a fourth control circuit 416(4). In this example, the third control circuit 416(3) and the fourth control circuit 416(4) are NMOS transistors. A drain node D of the third control circuit 416(3) is coupled to the source line SL, and a source node S of the third control circuit 416(3) is coupled to the first voltage input A. Thus, the third control circuit 416(3) is coupled to and between the first voltage input A of the sense amplifier 412 and the source line SL coupled to the MRAM bit cell 204. This is also shown in FIG. 7 illustrating the MRAM bit cell 204 undergoing a logic write '1' operation. The third control circuit 416(3) is configured to couple the source line SL to a second storage circuit 418(2) to pre-charge the second storage circuit 418(2) to a second reference voltage $V_{REF-2}$ as the source line voltage $V_{SL}$ on the source line SL. The source line voltage $V_{SL}$ is based on the application of the supply voltage $V_{DD}$ to the second voltage rail 409(2). The second storage circuit 418(2) can be a capacitor as an example. The third control circuit 416(3) couples the source line SL to the second storage circuit 418(2) to pre-charge the second storage circuit 418(2) to the supply voltage $V_{DD}$ in response to a second pre-charge signal $\Phi_{2-1}$ indicating a second pre-charge phase for a write operation, as shown for example in a timing diagram 502 in FIG. 5B. In this example, the second pre-charge signal $\Phi_{2-1}$ is coupled to the gate G of the third control circuit 416(3), and is an active high signal since the third control circuit 416(3) in this example is an NMOS transistor.

The second voltage sensing circuit 414(2) also includes the fourth control circuit 416(4), which is also an NMOS transistor in this example. A drain node D of the fourth control circuit 416(4) is coupled to the source line SL, and a source node S of the fourth control circuit 416(4) is coupled to the second voltage input B. Thus, the fourth control circuit 416(4) is coupled to and between the second voltage input B of the sense amplifier 412 and the source line SL coupled to the MRAM bit cell 204. This is also shown in FIG. 7 illustrating the MRAM bit cell 204 undergoing a logic write '1' operation. The fourth control circuit 416(4) is configured to couple the source line SL to the second voltage input B of the sense amplifier 412 to couple a second write operation voltage $V_{WRITE-2}$ as the source line voltage $V_{SL}$ on the source line SL, based on a supply voltage $V_{DD}$ applied to the second voltage rail 409(2), in response to a second write operation signal $\Phi_{2-2}$ indicating a second write operation phase. In this example, the second write operation signal $\Phi_{2-2}$ is coupled to the gate G of the fourth control circuit 416(4), and is an active high signal since the fourth control circuit 416(4) in this example is an NMOS transistor, as shown in FIG. 5B.

As shown in FIG. 5B, the second pre-charge signal $\Phi_{2-1}$ and the second write operation signal $\Phi_{2-2}$ are controlled to be active at different times. Thus, the second voltage sensing circuit 414(2) is controlled to couple to the source line voltage $V_{SL}$ to the second voltage rail 409(2) having the supply voltage $V_{DD}$ applied thereto at different times to apply the second reference voltage $V_{REF-2}$ and the second write operation voltage $V_{WRITE-2}$ to voltage inputs A and B of the sense amplifier 412 to be compared. In this regard, the third control circuit 416(3) of the second voltage sensing circuit 414(2) couples the source line voltage $V_{SL}$ as the second reference voltage $V_{REF-2}$ to the second storage circuit 418(2) be stored in the second pre-charge phase of the write operation, as shown by the second pre-charge signal $\Phi_{2-1}$ being active high in FIG. 5B. Then, during the write operation phase of the write operation, the second pre-charge signal $\Phi_{2-1}$ is controlled to be active low to deactivate the third control circuit 416(3) with the second reference voltage $V_{REF-2}$ stored in the second storage circuit 418(2). The second write operation signal $\Phi_{2-2}$ is controlled to be active high to activate the fourth control circuit 416(4) to couple the source line voltage $V_{SL}$ as the second write operation voltage $V_{WRITE-2}$ to the second voltage input B of the sense amplifier 412, as shown by the second write operation signal $\Phi_{2-2}$ being active high in FIG. 5B. Thus, the second reference voltage $V_{REF-2}$ that was applied to the source line SL during the pre-charge phase of the write operation and the second write operation voltage $V_{WRITE-2}$ applied on the source line SL during the write operation phase of the write operation are applied to the first and second voltage inputs A and B of the sense amplifier 412. The sense amplifier 412 is enabled based on the second write operation signal $\Phi_{2-2}$ to sense the difference in voltage between the second reference voltage $V_{REF-2}$, as a base line voltage, stored in the second storage circuit 418(2) at the first voltage input A, and the second write operation voltage $V_{WRITE-2}$, at the second voltage input B. The sense amplifier 412 generates the output voltage $V_O$ on the voltage output Q based on a detected difference between the second reference voltage $V_{REF-2}$, as a base line voltage, and the second write operation voltage $V_{WRITE-2}$. The detected difference in the second reference voltage $V_{REF-2}$ and the second write operation voltage $V_{WRITE-2}$ can be used to detect when the magnetic orientation of the MTJ 206 has switched for a logic '1' write operation, opposite of a logic '0' write operation. A difference in voltage between the second reference voltage $V_{REF-2}$, as a base line voltage, and the second write operation voltage $V_{WRITE-2}$ will occur when the magnetic orientation of the MTJ 206 switches because of the change in MTJ 206 resistance $R_{MTJ}$ of the MTJ 206 after switching.

In the example, the sensing circuit 410 in the MRAM bit cell 204 in FIG. 4, the first pre-charge and write operation signals $\Phi_{1-1}$, $\Phi_{1-2}$, and the second pre-charge and write operation signals $\Phi_{2-1}$, $\Phi_{2-2}$ may be controlled as being active (e.g., high) at different times and not at the same time. This is because the first pre-charge and write operation signals $\Phi_{1-1}$, $\Phi_{1-2}$ are for controlling the first voltage sensing circuit 414(1) for a logic '0' write operation to the MRAM bit cell 204. The second pre-charge and write operation signals $\Phi_{2-1}$, $\Phi_{2-2}$ are for controlling the second voltage sensing circuit 414(2) for a logic '1' write operation to the MRAM bit cell 204. Also, although not required, it may be desired to have the first pre-charge and write operation signals $\Phi_{1-1}$, $\Phi_{1-2}$ not be active (e.g., high) at the same time in response to a logic '0' write operation, and the second pre-charge and write operation signals $\Phi_{2-1}$, $\Phi_{2-2}$ to not be active (e.g., high) at the same time in response to a logic '1' write operation.

Figure 8A:
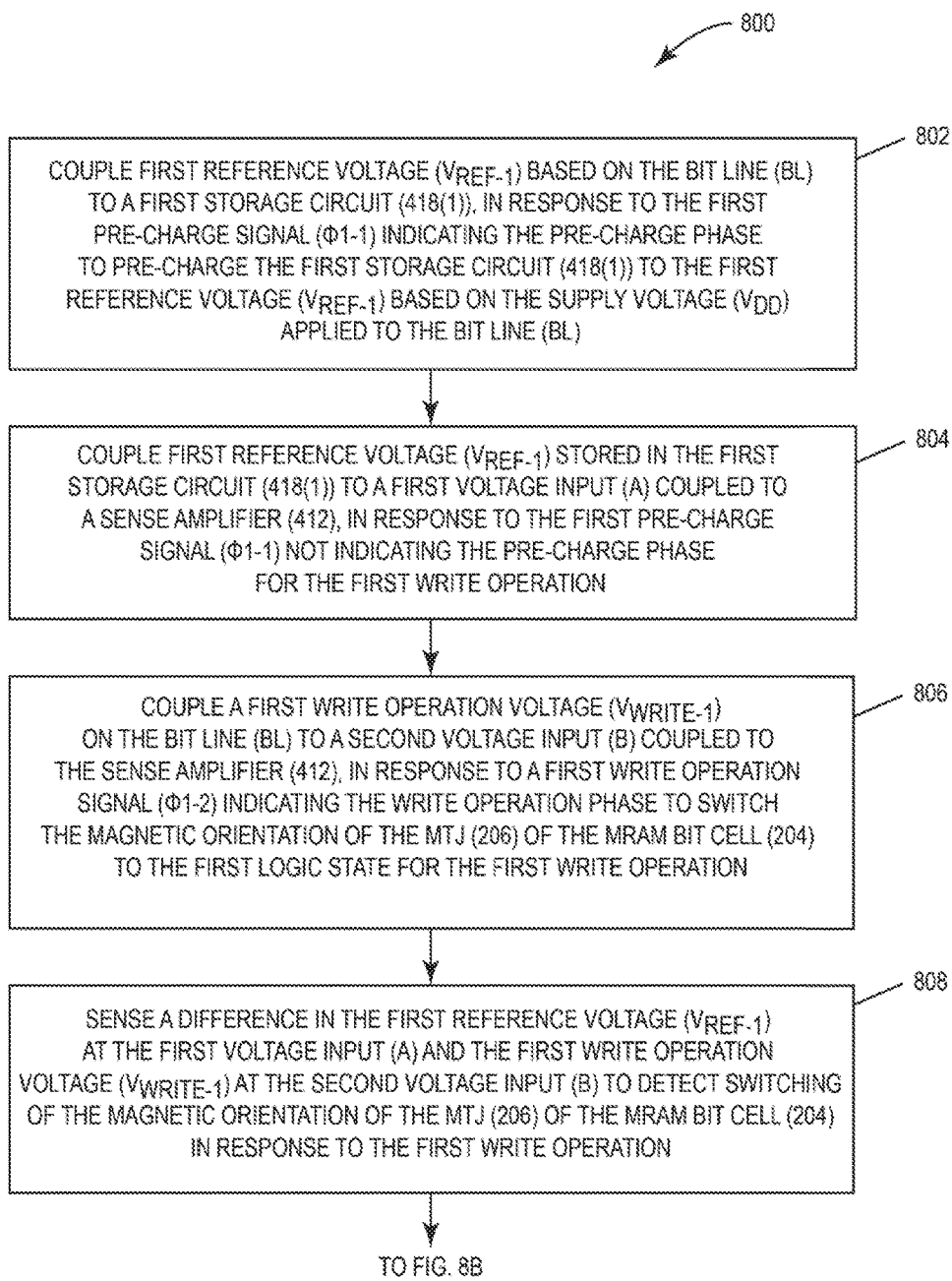
FIG. 8A is a flowchart illustrating an exemplary process for the pre-charge phase and the write operation phase of the sensing circuit in FIG. 4 for sensing a reference voltage and a write operation voltage in an MRAM bit cell for a logic '0' write operation for detecting MTJ switching and the termination of the write operation.

FIG. 8A is a flowchart illustrating an exemplary process 800 for the pre-charge phase and the write operation phase of the sensing circuit 410 in FIG. 4 to provide for the sense amplifier 412 to sense the first reference voltage $V_{REF-1}$ and the first write operation voltage $V_{WRITE-1}$ in the MRAM bit cell 204 for a logic '0' write operation, which is also shown in FIG. 6. In this regard, with reference to FIG. 6, the process 800 includes coupling the bit line BL to a first storage circuit 418(1), in response to the first pre-charge signal $\Phi_{1-1}$ indicating the pre-charge phase to pre-charge the first storage circuit 418(1) to a first reference voltage $V_{REF-1}$ based on the supply voltage $V_{DD}$ applied to the bit line BL (block 802 in FIG. 8A). In the example of the sensing circuit 410 in FIG. 4, this step involves activating the first control circuit 416(1) coupled to the bit line BL coupled to the MRAM bit cell 204 to couple the first reference voltage $V_{REF-1}$ as the bit line voltage $V_{BL}$ to the first storage circuit 418(1) in response to the first write operation. The process 800 also involves coupling the bit line voltage $V_{BL}$ stored in the first storage circuit 418(1) to a first voltage input A coupled to a sense amplifier 412, in response to the first pre-charge signal $\Phi_{1-1}$ not indicating the pre-charge phase for the first write operation (block 804 in FIG. 8A). In the example of the sensing circuit 410 in FIG. 4, this step of deactivating the first control circuit 416(1) involves activating the second control circuit 416(2) coupled to the bit line BL, to couple a first write operation voltage $V_{WRITE-1}$ on the bit line BL to a second voltage input B coupled to the sense amplifier 412, in response to a first write operation signal $\Phi_{1-2}$ indicating the write operation phase to switch the magnetic orientation of the MTJ 206 of the MRAM bit cell 204 to the first logic state for the first write operation (block 806 in FIG. 8A). The process 800 also involves sensing a difference in the first reference voltage $V_{REF-1}$ at the first voltage input A and the first write operation voltage $V_{WRITE-1}$ at the second voltage input B to detect switching of the magnetic orientation of the MTJ 206 of the MRAM bit cell 204 in response to the first write operation (block 808 in FIG. 8A).

Figure 8B:
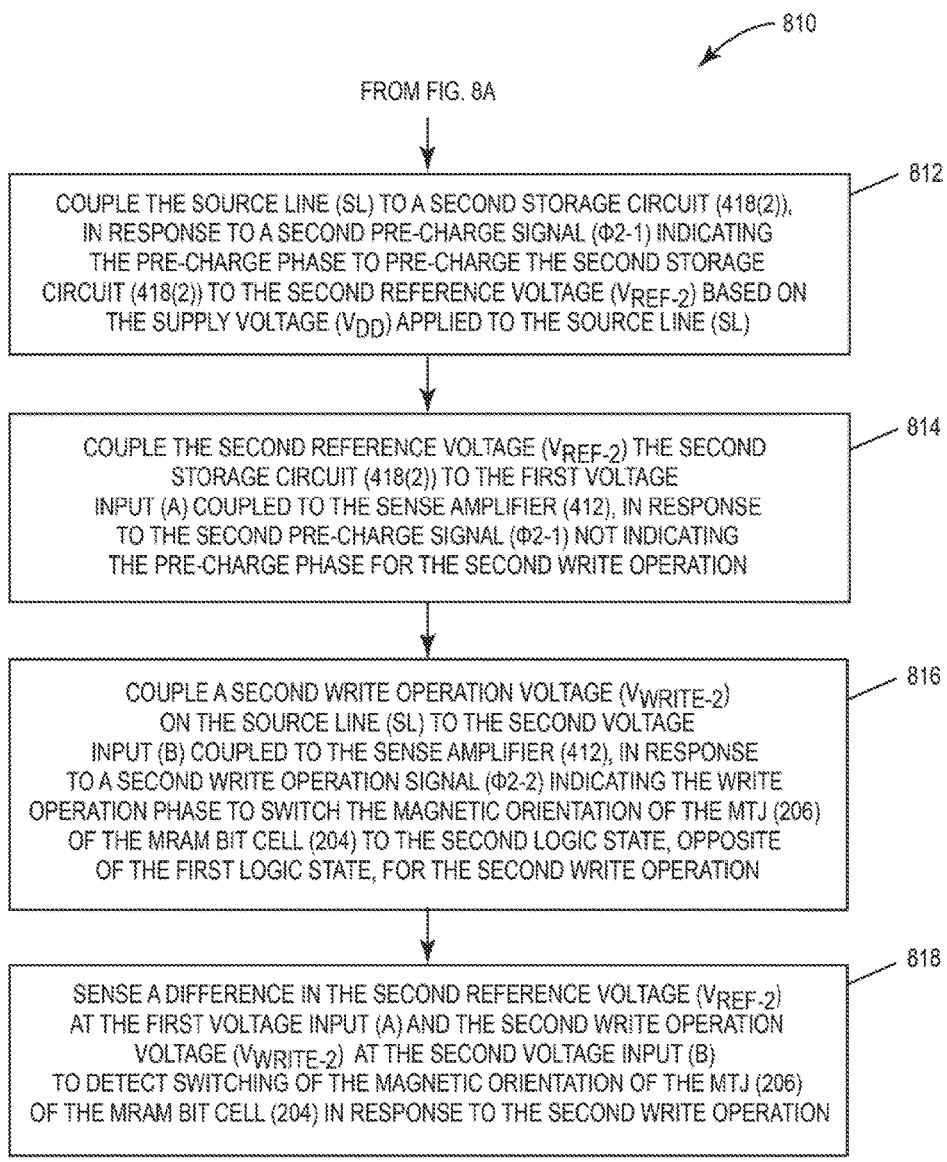
FIG. 8B is a flowchart illustrating an exemplary process for the pre-charge phase and the write operation phase of the sensing circuit in FIG. 4 for sensing a reference voltage and a write operation voltage in an MRAM bit cell for a logic '1' write operation for detecting MTJ switching and the termination of the write operation.

FIG. 8B is a flowchart illustrating an exemplary process 810 for the pre-charge phase and the write operation phase of the sensing circuit 410 in FIG. 4 to provide for the sense amplifier 412 to sense the first reference voltage $V_{REF-1}$ and the first write operation voltage $V_{WRITE-1}$ in the MRAM bit cell 204 for a logic '0' write operation, which is also shown in FIG. 7. The process 810 involves coupling the source line SL to a second storage circuit 418(2), in response to a second pre-charge signal $\Phi_{2-1}$ indicating the pre-charge phase to pre-charge the second storage circuit 418(2) to a second reference voltage $V_{REF-2}$ based on the supply voltage $V_{DD}$ applied to the source line SL (block 812 in FIG. 8B). In the example of the sensing circuit 410 in FIG. 4, this step involves activating the third control circuit 416(3) coupled to the source line SL coupled to the MRAM bit cell 204 to couple the second reference voltage $V_{REF-2}$ as the source line voltage $V_{SL}$ to the second storage circuit 418(2) in response to the second write operation. The process 810 also involves coupling the second reference voltage $V_{REF-2}$ as the source line voltage $V_{SL}$ stored in the second storage circuit 418(2) to the first voltage input A coupled to the sense amplifier 412 (block 814 in FIG. 8B). In the example of the sensing circuit 410 in FIG. 4, this step involves deactivating the third control circuit 416(3). The process 810 also involves coupling a second write operation voltage $V_{WRITE-2}$ on the source line SL to the second voltage input B coupled to the sense amplifier 412, in response to a second write operation signal $\Phi_{2-2}$ indicating the write operation phase to switch the magnetic orientation of the MTJ 206 of the MRAM bit cell 204 to the second logic state, opposite of the first logic state, for the second write operation (block 816 in FIG. 8B). In the example of the sensing circuit 410 in FIG. 4, this step involves activating the fourth control circuit 416(4). The process 810 also involves sensing a difference in the second reference voltage $V_{REF-2}$ at the first voltage input A and the second write operation voltage $V_{WRITE-2}$ at the second voltage input B to detect switching of the magnetic orientation of the MTJ 206 of the MRAM bit cell 204 in response to the second write operation (block 818 in FIG. 8B).

Figure 9:
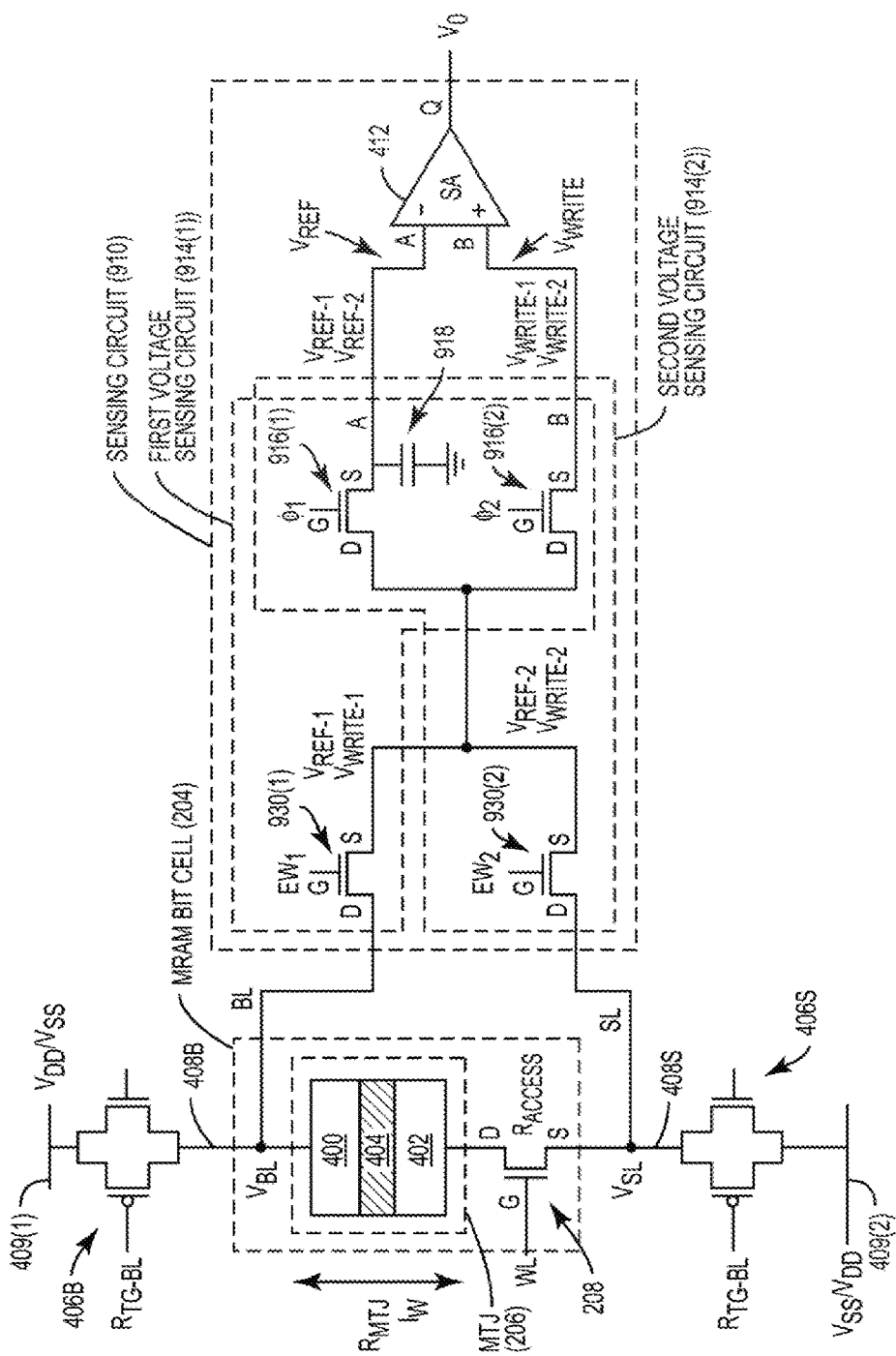
FIG. 9 is a schematic diagram of another exemplary MRAM bit cell in the MRAM array in FIG. 2 and a sensing circuit coupled to the MRAM bit cell, wherein the sensing circuit is configured to sense a reference voltage applied to a supply voltage rail in a pre-charge phase and sense a write operation voltage applied to the supply voltage rail in a write operation phase, to detect MTJ switching in the MRAM bit cell in response to a write operation.

As discussed above, the first pre-charge and write operation signals $\Phi_1$ and the second pre-charge and write operation signals $\Phi_2$ control the operations of first and second voltage sensing circuits 914(1), 914(2) in a sensing circuit 910 in FIG. 9 in response to logic '0' and '1' write operations, respectively. As also discussed previously, the write operation signals $\Phi_2$ should be controlled to be active after their respective pre-charge signals $\Phi_1$ are active to allow the respective bit line voltage $V_{BL}$ or source line voltage $V_{SL}$, depending on the logic of the write operation, to charge a respective storage circuit 918. Circuits to generate the pre-charge signals $\Phi_1$ and the write operation signals $\Phi_2$ can be provided as part of the MRAM bit cell 204, the MRAM array 202, or the MRAM 200 in FIG. 9 for example, or outside the MRAM 200.

FIG. 9 is a schematic diagram of the exemplary MRAM bit cell 204, with common elements shown with common element numbers between FIGS. 4 and 9. However, the alternative exemplary sensing circuit 910 is provided in FIG. 9 to sense the voltage at either the source line SL or the bit line BL (depending on the logic of the write operation) to track write operations to the MRAM bit cell 204. The sensed voltage at the source line SL or the bit line BL, depending on the logic of the write operation, can be used to detect the end of a write operation to the MRAM bit cell 204. In this regard, the sensing circuit 910 may be provided for each MRAM bit cell 204(0)(0)-204(M)(N) in the MRAM array 202 in FIG. 2 as one example. In another example, a plurality of sensing circuits 910 may be provided for each memory column 0-N in the MRAM array 202 in FIG. 2, where the sensing circuits 410 are configured to sense voltage at the supply voltage rail of the MRAM bit cells 204(0)0-2040(N) in a selected memory row 0-M to be written. To sense the bit line voltage $V_{BL}$ or source line voltage $V_{SL}$ at the bit line BL or source line SL, respectively, applied to the MRAM bit cell 204 in response to a write operation to detect the MTJ 206 switching therein, the sensing circuit 910 includes the sense amplifier 412 that has been previously discussed. The sensing circuit 410 is configured to provide the bit line voltage $V_{BL}$ or the source line voltage $V_{SL}$ applied to the MRAM bit cell 204 based on the supply voltage $V_{DD}$ as a reference voltage $V_{REF}$ in a pre-charge phase of the write operation as opposed to a fixed reference voltage for example.

The sensing circuit 910 in FIG. 9 is configured to be able to couple either the bit line voltage rail 408B or the source line voltage rail 408S, depending on the logic of the write operation, to increase sensing margin. For the sensing circuit 910 to be able to couple to the bit line BL for performing a sensing operation when performing a logic '0' write operation, the first voltage sensing circuit 914(1) is provided. The first voltage sensing circuit 914(1) in this example includes a first control circuit 916(1) and a second control circuit 916(2). In this example, the first control circuit 916(1) and the second control circuit 916(2) are NMOS transistors. The first control circuit 916(1) is coupled to the first voltage input A of the sense amplifier 412. The second control circuit 916(2) is coupled to the second voltage input B of the sense amplifier 412. The first voltage sensing circuit 914(1) also includes a bit line control circuit 930(1) that is coupled to and between the bit line BL and the first and second control circuits 916(1), 916(2). The bit line control circuit 930(1) controls whether the bit line BL is coupled to the first and second control circuits 916(1), 916(2). A drain node D of the first control circuit 916(1) is coupled to the bit line control circuit 930(1), and a source node S of the first control circuit 916(1) is coupled to the first voltage input A. Thus, the first control circuit 916(1) is coupled to and between the first voltage input A of the sense amplifier 412, and the bit line control circuit 930(1) is coupled to the MRAM bit cell 204. The first control circuit 916(1) is configured to couple the bit line BL when the bit line control circuit 930(1) is activated, to the storage circuit 918 to pre-charge the storage circuit 918 to a first reference voltage $V_{REF-1}$ as the bit line voltage $V_{BL}$ on the bit line BL. The storage circuit 918 can be a capacitor as an example. Activation of the bit line control circuit 930(1) and the first control circuit 916(1) couples the bit line BL to the storage circuit 918 to pre-charge the storage circuit 918 to the bit line voltage $V_{BL}$. Activation of the first control circuit 916(1) is controlled by a pre-charge signal $\Phi_1$ indicating a first pre-charge phase for a write operation. In this example, the pre-charge signal $\Phi_1$ is coupled to the gate G of the first control circuit 916(1), and is an active high signal since the first control circuit 916(1) in this example is an NMOS transistor. Activation of the bit line control circuit 930(1) is controlled by a bit line control signal $EW_1$. In this example, the bit line control signal $EW_1$ is coupled to the gate G of the bit line control circuit 930(1), and is an active high signal since the bit line control circuit 930(1) in this example is an NMOS transistor.

For the sensing circuit 910 to be able to couple to the source line SL for performing a sensing operation when performing a logic '1' write operation, the second voltage sensing circuit 914(2) is provided. The second voltage sensing circuit 914(2) in this example also includes the first control circuit 916(1) and the second control circuit 916(2). As previously discussed above, the first control circuit 916(1) is coupled to the first voltage input A of the sense amplifier 412, and the second control circuit 916(2) is coupled to the second voltage input B of the sense amplifier 412. The second voltage sensing circuit 914(2) also includes a source line control circuit 930(2) that is coupled to and between the source line SL and the first and second control circuits 916(1), 916(2). The source line control circuit 930(2) controls whether the source line SL is coupled to the first and second control circuits 916(1), 916(2). The drain node D of the first control circuit 916(1) is coupled to the source line control circuit 930(2), and the source node S of the first control circuit 916(1) is coupled to the first voltage input A.

Thus, the first control circuit 916(1) is coupled to and between the first voltage input A of the sense amplifier 412, and the source line control circuit 930(2) is coupled to the MRAM bit cell 204. The first control circuit 916(1) is configured to couple the source line SL when the source line control circuit 930(2) is activated, to the storage circuit 918 to pre-charge the storage circuit 918 to a second reference voltage $V_{REF-2}$ as the source line voltage $V_{SL}$ on the source line SL. Activation of the source line control circuit 930(2) and the first control circuit 916(1) couples the source line SL to the storage circuit 918 to pre-charge the storage circuit 918 to the source line voltage $V_{SL}$. As discussed above, activation of the first control circuit 916(1) is controlled by a pre-charge signal $\Phi_1$ indicating a first pre-charge phase for a write operation. Activation of the source line control circuit 930(2) is controlled by a source line control signal $EW_2$. In this example, the source line control signal $EW_2$ is coupled to the gate G of the source line control circuit 930(2), and is an active high signal since the source line control circuit 930(2) in this example is an NMOS transistor.

The bit line control signal $EW_1$ and the source line control signal $EW_2$ are controlled to be active at different times, based on the logic of the write operation. The bit line control signal $EW_1$ is driven to an active state for a logic '0' write operation so that the bit line BL is coupled to the first and second control circuits 916(1), 916(2). The source line control signal $EW_2$ is driven to an active state for a logic '1' write operation so that the bit line BL is coupled to the first and second control circuits 916(1), 916(2). The bit line control signal $EW_1$ and source line control signal $EW_2$ are not driven active at the same time. This allows the same first and second control circuits 916(1), 916(2) to control the coupling of the bit line BL and the source line SL for both logic '0' and logic '1' write operations. The pre-charge signal $\Phi_1$ and the write operation signal $\Phi_2$ are also controlled to be active at different times for a given write operation. In this manner, the storage circuit 918 is pre-charged to a reference voltage ($V_{REF-1}$ for a logic '0' write operation and $V_{REF-2}$ for a logic '1' write operation) in response to the pre-charge signal $\Phi_1$ being drive active. Then, in response to the write operation signal $\Phi_2$ being driven active, the bit line voltage $V_{BL}$ (as the first write operation voltage $V_{WRITE-1}$ for a logic '0' write operation) or the source line voltage $V_{SL}$ (as the second write operation voltage $V_{WRITE-2}$ for a logic '1' write operation) is coupled to the second voltage input B of the sense amplifier 412. The first or second reference voltage $V_{REF-1}$, $V_{REF-2}$ stored in the storage circuit 918 is present at the first voltage input A of the sense amplifier 412. The sense amplifier 412 can detect switching of the MTJ 206 based on the difference between the first or second reference voltage $V_{REF-1}$, $V_{REF-2}$ and the first or second write operation voltage $V_{WRITE-1}$, $V_{WRITE-2}$.

Figure 10A:
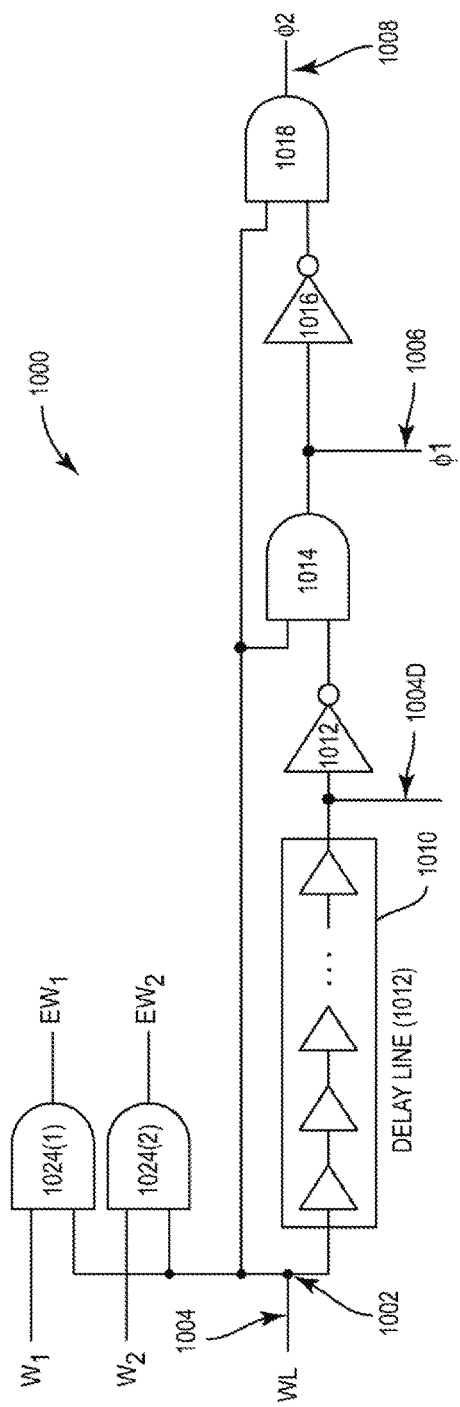
FIG. 10A is a schematic diagram of an exemplary phase control circuit for generating the pre-charge phase write operation signals that control the pre-charge and write operation phases of the sensing circuit in FIG. 9, in response to a write operation.

FIG. 10A is a schematic diagram of an exemplary phase control circuit 1000 that can be provided for generating the pre-charge signals $\Phi_1$ and the write operation signals D in the sensing circuit 910 in FIG. 9 for both logic '0' and logic '1' write operations. As shown in FIG. 10A, the phase control circuit 1000 includes a phase control input 1002 configured to be coupled to a word line WL coupled to the MRAM bit cell 204 (see FIG. 9). The phase control input 1002 is configured to receive a word line signal 1004 from the word line WL in response to a write operation to the MRAM bit cell 204. The phase control circuit 1000 also includes a first phase control output 1006 and a second phase control output 1008. The phase control circuit 1000 is configured to generate a pre-charge signal $\Phi_1$ indicating the pre-charge phase on the first phase control output 1006 in response to the word line signal 1004. The phase control circuit 1000 may include a delay circuit 1010, which may be in the form of a delay line 1012 formed by a series of inverter gates, that is configured to delay the word line signal 1004 to generate a delayed word line signal 1004D. The delayed word line signal 1004D may then be further inverted if needed by an inverter gate 1012 and gated by an AND-based gate 1014 with the word line signal 1004. The delayed word line signal 1004D controls deactivation of the pre-charge signal $\Phi_1$ when the pre-charge phase is completed. The phase control circuit 1000 is also configured to generate a write operation signal $\Phi_2$ indicating the write operation phase on the second phase control output 1008 in response to the delayed word line signal 1004D. The write operation signal $\Phi_2$ is generated on the second phase control output 1008 as a result of delaying the delayed word line signal 1004D through an inverter gate 1016 and gating the signal through an AND-based gate 1018 with the word line signal 1004. Thus, when the word line signal 1004 becomes inactive low, this will cause the write operation signal $\Phi_2$ to also become inactive low.

With continuing reference to FIG. 10A, the bit line control signal $EW_1$ and the source line control signal $EW_2$ are driven by control circuits 1024(1), 1024(2). The control circuits 1024(1), 1024(2) are configured to drive the bit line control signal $EW_1$ and the source line control signal $EW_2$ active in response to respective write operation control signals $W_1$ and $W_2$ when a write operation is active based on the word line signal 1004.

For example, the control circuits 1024(1), 1024(2) can be AND-based gates. In response to a logic '0' write operation, the control signal $W_1$ is active and the control signal $W_2$ is not active, which causes the control circuit 1024(1) to drive the bit line control signal $EW_1$ active in response to the word line signal 1004 being active. In response to a logic '1' write operation, the control signal $W_2$ is active and the control signal $W_1$ is not active, which causes the control circuit 1024(2) to drive the source line control signal $EW_2$ active in response to the word line signal 1004 being active. The control signals $W_1$ and $W_2$ are not driven active at the same time in this example FIG. 10B is a timing diagram 1020 illustrating exemplary timing of generation of the pre-charge signal $\Phi_1$ and the write operation signal $\Phi_2$ generated by the phase control circuit 1000 in FIG. 10A for a logic '0' write operation performed in the MRAM bit cell 204 in FIG. 9. As shown therein, for a logic '0' write operation, the bit line control signal $EW_1$ is driven active (e.g., high in this example) by the control circuit 1024(1) to activate the bit line control circuit 930(1) in the first voltage sensing circuit 914(1). The source line control signal $EW_2$ is driven low by the control circuit 1024(2) to deactivate the source line control circuit 930(2) in the second voltage sensing circuit 914(2) so as to not couple the source line SL to the sense amplifier 412. The word line signal 1004 is pulled active high (H) at time $t_0$. The pre-charge signal $\Phi_1$ is pulled active high (H) in response to the delayed word line signal (WL_del) 1004D as an active low (L) signal at time $t_0$. After a delay $d_1$ by the delay circuit 1010 in FIG. 10B at time $t_1$, the pre-charge signal $\Phi_1$ is pulled inactive low (L) in response to the delayed word line signal 1004D, whereas the write operation signal $\Phi_2$ is pulled active high (H) in response to the delayed word line signal 1004D also at time $t_1$ The write operation signal $\Phi_2$ is pulled inactive low (L) in response to the word line signal 1004 being pulled inactive low (L) at time $t_2$.

Figure 10C:
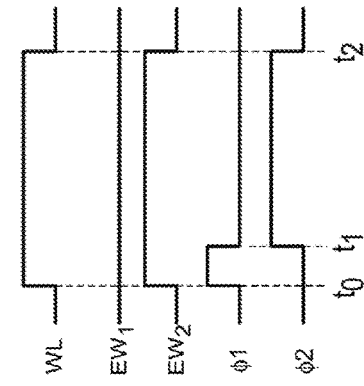
FIGS. 10B and 10C are timing diagrams illustrating exemplary timing for pre-charge phases and write operation phases of the sensing circuit in FIG. 9 to detect MTJ switching in the MRAM bit cell in response to a write operation.
Figure 10B:
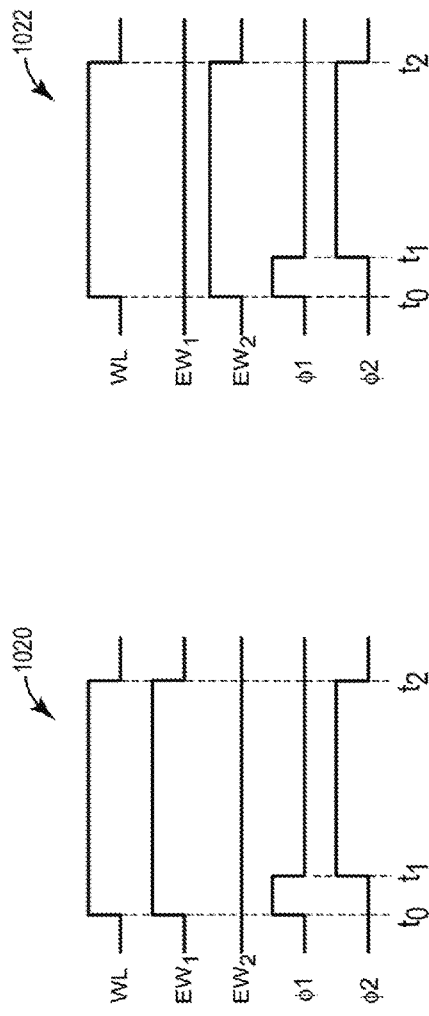

FIG. 10C is a timing diagram 1022 illustrating exemplary timing of generation of the pre-charge signal $\Phi_1$ and the write operation signal $\Phi_2$ generated by the phase control circuit 1000 in FIG. 10A for a logic '1' write operation performed in the MRAM bit cell 204 in FIG. 9. As shown therein, for a logic '1' write operation, the source line control signal $EW_2$ is driven high by the control circuit 1024(2) to activate the source line control circuit 930(2) in the second voltage sensing circuit 914(2). The bit line line control signal $EW_1$ is driven low by the control circuit 1024(1) to deactivate the bit line control circuit 930(1) in the first voltage sensing circuit 9140 so as to not couple the bit line BL to the sense amplifier 412. The word line signal 1004 is pulled active high (H) at time $t_0$. The pre-charge signal $\Phi_1$ is pulled active high (H) in response to the delayed word line signal (WL_del) 1004D as an active low (L) signal at time $t_0$. After a delay $d_1$ by the delay circuit 1010 in FIG. 10C at time $t_1$, the pre-charge signal $\Phi_1$ is pulled inactive low (L) in response to the delayed word line signal 1004D, whereas the write operation signal $\Phi_2$ is pulled active high (H) in response to the delayed word line signal 1004D also at time $t_1$ The write operation signal $\Phi_2$ is pulled inactive low (L) in response to the word line signal 1004 being pulled inactive low (L) at time $t_2$.

Figure 11:
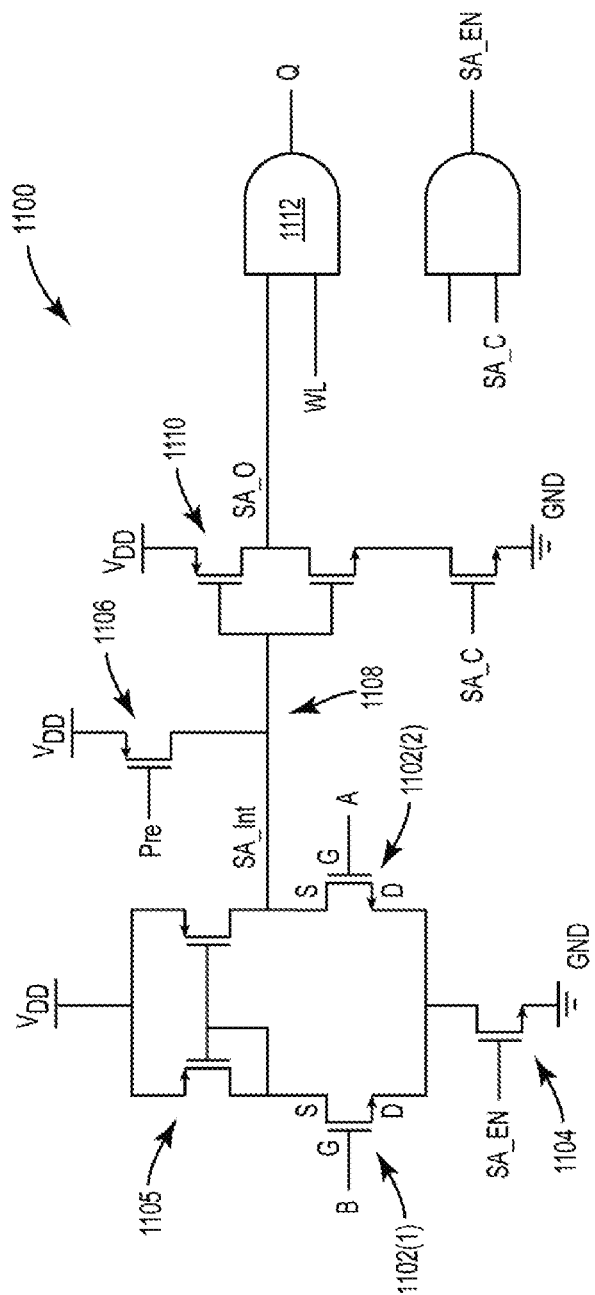
FIG. 11 is a schematic diagram of an exemplary sense amplifier that can be included in the sensing circuit in FIG. 4.

FIG. 11 is a schematic diagram of an exemplary sense amplifier 1100 that could be used as the sense amplifier 412 in FIGS. 4 and 9 for example to sense the bit line voltage $V_{BL}$ and the source line voltage $V_{SL}$ from the respective bit line BL and source line SL coupled to the MRAM bit cell 204. The first and second voltage inputs A and B are shown as being coupled to gates G of sense transistors 1102(1), 1102(2). An enable transistor 1104 is controlled by a sense amplifier enable signal SA_EN to couple drain nodes D of the sense transistors 1102(1), 1102(2) to ground GND when the sense amplifier 1100 is enabled. A latch circuit 1105 is provided in the sense amplifier 1100 and coupled to source nodes S of the sense transistors 1102(1), 1102(2) to operate like a storage circuit to retain the sensed voltage on the first and second voltage inputs A and B. A pre-charge circuit 1106 is provided and coupled to an output node 1108 and configured to pre-charge the output node 1108, which is then either pulled down to GND or not pulled down and left pre-charged for supply voltage $V_{DD}$ according to a difference between voltages on the first and second voltage inputs A and B. An inverter circuit 1110 is coupled to the output node 1108, wherein the inverter circuit 1110 has an inverted output node SA_O. The inverted output node SA_O is gated with a word line WL through an AND-based gate 1112 to generate the voltage output Q.

In another aspect, a sensing circuit for sensing MTJ switching in an MRAM bit cell in response to a write operation is provided. The sensing circuit includes a sensing means for generating an output voltage based on a difference between a reference voltage and a write operation voltage. For example, the sensing means may be the sense amplifier 412 in FIG. 4 or 9. The sensing circuit also includes a storage means coupled to the sensing means. The storage means may be the first and second storage circuits 418(1), 418(2) in FIG. 4, or the common storage circuit 918 in FIG. 9, as examples. The storage means may be one or more capacitor circuits that include one or more capacitors. The sensing circuit also includes a first sensing means for pre-charging the storage means to a first reference voltage based on a supply voltage applied to a bit line coupled to an MRAM bit cell in response to a first pre-charge signal indicating a pre-charge phase in response to a first write operation, and for discharging the first reference voltage stored in the storage means to the sensing means in response to the first pre-charge signal not indicating a pre-charge phase. As examples, the first sensing means may be the first control circuit 416(1) in FIG. 4 or the first control circuit 916(1) in FIG. 9 as examples, and may be included or part of a voltage sensing circuit such as the first voltage sensing circuit 414(1) in FIG. 4 or the first voltage sensing circuit 914(1) in FIG. 9. The sensing circuit also includes a second sensing means for coupling the sensing means to the bit line to apply a first write operation voltage on the bit line to the sensing means in response to a first write operation signal indicating a write operation phase in response to the first write operation to the MRAM bit cell of a first logic state. As examples, the second sensing means may be the second control circuit 416(2) in FIG. 4 or the second control circuit 916(2) in FIG. 9 as examples, and may be included or part of a voltage sensing circuit such as the first voltage sensing circuit 414(1) in FIG. 4 or the first voltage sensing circuit 914(1) in FIG. 9. The sensing circuit also includes a third sensing means for pre-charging the storage means to a second reference voltage based on a supply voltage applied to a source line coupled to the MRAM bit cell in response to a second pre-charge signal indicating a pre-charge phase in response to a second write operation, and for discharging the second reference voltage stored in the storage means to the sensing means in response to the first pre-charge signal not indicating a pre-charge phase. As examples, the third sensing means may be the third control circuit 416(3) in FIG. 4 as an example, and may be included or part of a voltage sensing circuit, such as the second voltage sensing circuit 414(2) in FIG. 4 or the second voltage sensing circuit 914(2) in FIG. 9. The sensing circuit also includes a fourth sensing means for coupling the sensing means to the source line to apply a second write operation voltage on the source line to the sensing means in response to a second write operation signal indicating a write operation phase in response to the second write operation to the MRAM bit cell of a second logic state opposite the first logic state. As examples, the fourth sensing means may be the fourth control circuit 416(4) in FIG. 4 as an example, and may be included or part of a voltage sensing circuit, such as the second voltage sensing circuit 414(2) in FIG. 4 or the second voltage sensing circuit 914(2) in FIG. 9.

An MRAM that includes an MRAM array of MRAM bit cells and sensing circuits to detect MTJ switching in the MRAM bit cells involved in a write operation, including but not limited to the sensing circuits 410, 910 in FIGS. 4 and 9 respectively, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 12:
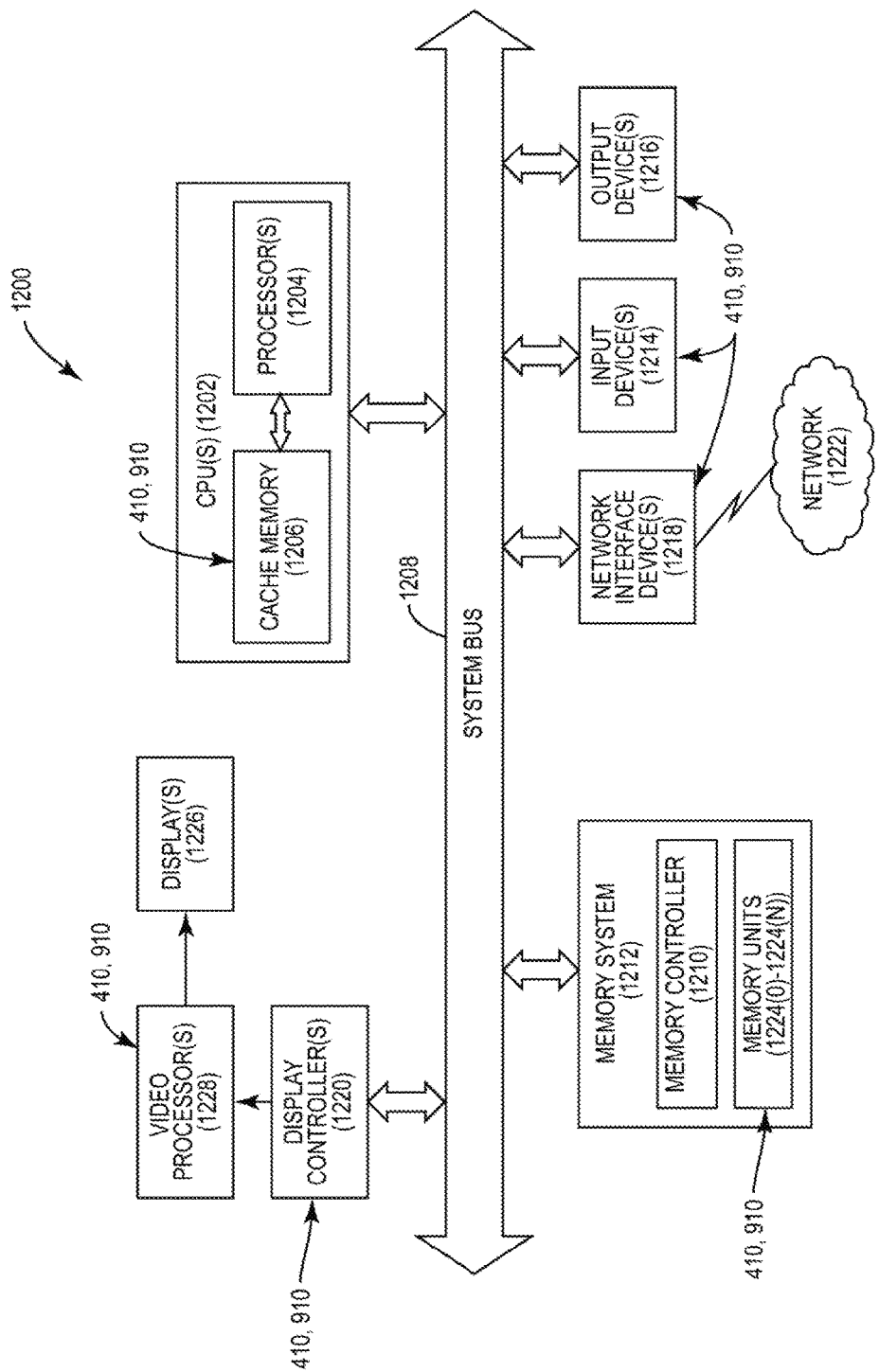
FIG. 12 is a block diagram of an exemplary processor-based system that can include an MRAM that includes an MRAM array of MRAM bit cells and sensing circuits to detect MTJ switching in the MRAM bit cells involved in a write operation, including but not limited to the sensing circuits in FIGS. 4 and 11, respectively.

In this regard, FIG. 12 illustrates an example of a processor-based system 1200 that can include an MRAM that includes an MRAM array of MRAM bit cells and sensing circuits to detect MTJ switching in the MRAM bit cells involved in a write operation, including but not limited to the sensing circuits 410, 910 in FIGS. 4 and 9, respectively. In this example, the processor-based system 1200 includes one or more central processing units (CPUs) 1202, each including one or more processors 1204. The CPU(s) 1202 may have cache memory 1206 coupled to the processor(s) 1204 for rapid access to temporarily stored data. As an example, the cache memory 1206 could include MRAM that includes an MRAM array of MRAM bit cells and sensing circuits to detect MTJ switching in the MRAM bit cells involved in a write operation, including but not limited to the sensing circuits 410, 910 in FIGS. 4 and 9, respectively. The CPU(s) 1202 is coupled to a system bus 1208 and can intercouple master and slave devices included in the processor-based system 1200. As is well known, the CPU(s) 1202 communicates with these other devices by exchanging address, control, and data information over the system bus 1208. For example, the CPU(s) 1202 can communicate bus transaction requests to a memory controller 1210 as an example of a slave device. Although not illustrated in FIG. 12, multiple system buses 1208 could be provided, wherein each system bus 1208 constitutes a different fabric.

Other master and slave devices can be connected to the system bus 1208. As illustrated in FIG. 12, these devices can include a memory system 1212, one or more input devices 1214, one or more output devices 1216, one or more network interface devices 1218, and one or more display controllers 1220, as examples. Each of the memory system 1212, the one or more input devices 1214, the one or more output devices 1216, the one or more network interface devices 1218, and the one or more display controllers 1220 can include an MRAM that includes an MRAM array of MRAM bit cells and sensing circuits to detect MTJ switching in the MRAM bit cells involved in a write operation, including but not limited to the sensing circuits 410, 910 in FIGS. 4 and 9, respectively. The input device(s) 1214 can include any type of input device, including, but not limited to, input keys, switches, voice processors, etc. The output device(s) 1216 can include any type of output device, including, but not limited to, audio, video, other visual indicators, etc. The network interface device(s) 1218 can be any device configured to allow exchange of data to and from a network 1222. The network 1222 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1218 can be configured to support any type of communications protocol desired. The memory system 1212 can include one or more memory units 1224(0)-1224(N).

The CPU(s) 1202 may also be configured to access the display controller(s) 1220 over the system bus 1208 to control information sent to one or more displays 1226. The display controller(s) 1220 sends information to the display(s) 1226 to be displayed via one or more video processors 1228, which process the information to be displayed into a format suitable for the display(s) 1226. The display(s) 1226 can include any type of display, including, but not limited to, a cathode ray tube (CRT), a liquid crystal display (LCD), a plasma display, a light emitting diode (LED) display, etc.

Figure 13:
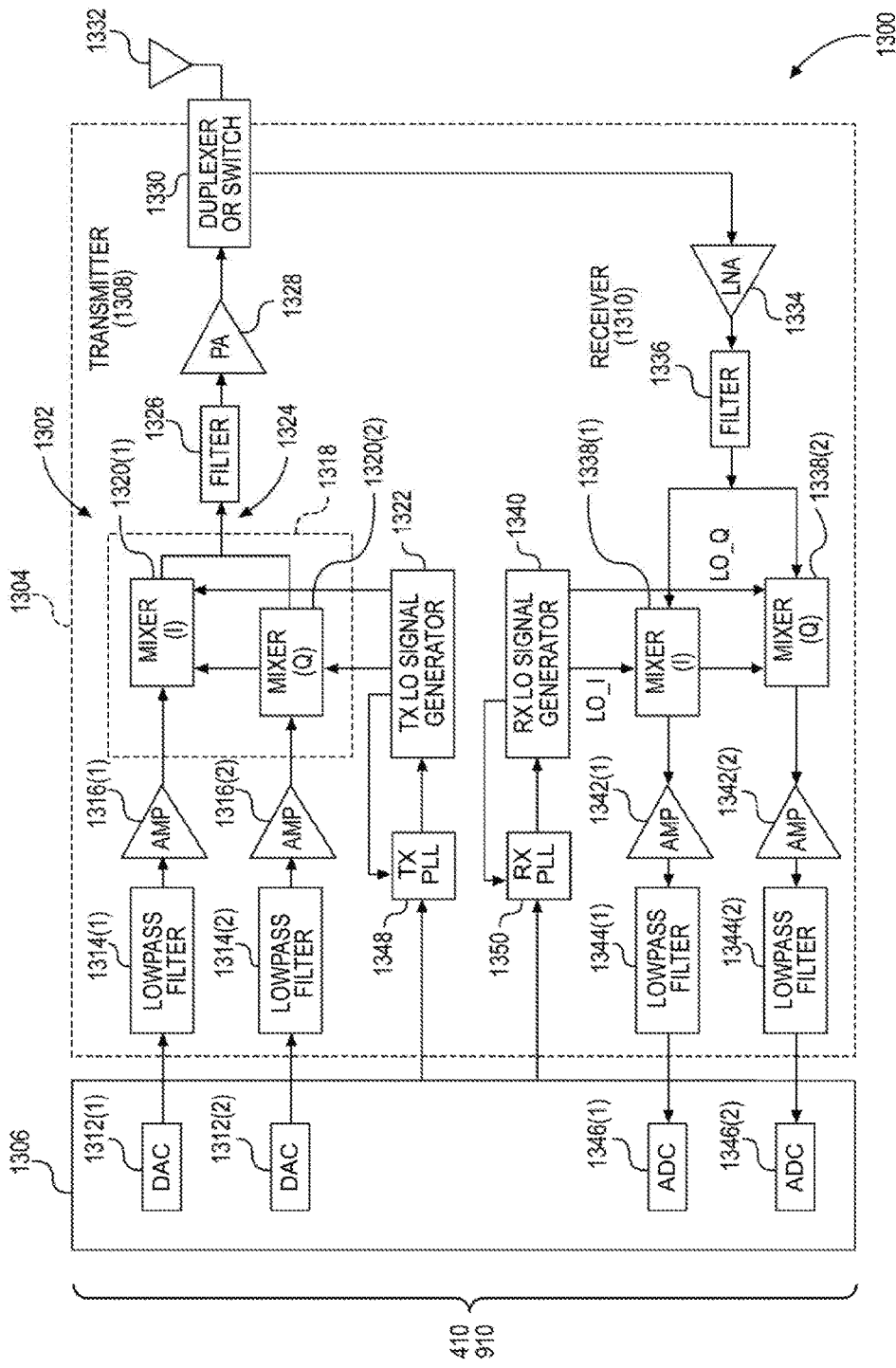
FIG. 13 is a block diagram of an exemplary wireless communications device that includes radio frequency (RF) components formed in an integrated circuit (IC), wherein any of the components therein can include an MRAM that includes an MRAM array of MRAM bit cells and sensing circuits to detect MTJ switching in the MRAM bit cells involved in a write operation, including but not limited to the sensing circuits in FIGS. 4 and 11, respectively.

FIG. 13 illustrates an exemplary wireless communications device 1300 that includes radio frequency (RF) components formed in an integrated circuit (IC) 1302, wherein any of the components therein can include an MRAM that includes an MRAM array of MRAM bit cells and sensing circuits to detect MTJ switching in the MRAM bit cells involved in a write operation, including but not limited to the sensing circuits 410, 910 in FIGS. 4 and 9, respectively. In this regard, the wireless communications device 1300 may be provided in the IC 1302. The wireless communications device 1300 may include or be provided in any of the above referenced devices, as examples. As shown in FIG. 13, the wireless communications device 1300 includes a transceiver 1304 and a data processor 1306. The data processor 1306 may include a memory to store data and program codes. The transceiver 1304 includes a transmitter 1308 and a receiver 1310 that support bi-directional communications. In general, the wireless communications device 1300 may include any number of transmitters 1308 and/or receivers 1310 for any number of communication systems and frequency bands. All or a portion of the transceiver 1304 may be implemented on one or more analog ICs, RF ICs (RFICs), mixed-signal ICs, etc.

The transmitter 1308 or the receiver 1310 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1310. In the direct-conversion architecture, a signal is frequency-converted between RF and baseband in one stage. The super-heterodyne and direct-conversion architectures may use different circuit blocks and/or have different requirements. In the wireless communications device 1300 in FIG. 13, the transmitter 1308 and the receiver 1310 are implemented with the direct-conversion architecture.

In the transmit path, the data processor 1306 processes data to be transmitted and provides I and Q analog output signals to the transmitter 1308. In the exemplary wireless communications device 1300, the data processor 1306 includes digital-to-analog converters (DACs) 1312(1), 1312(2) for converting digital signals generated by the data processor 1306 into the I and Q analog output signals, e.g., I and Q output currents, for further processing.

Within the transmitter 1308, lowpass filters 1314(1), 1314(2) filter the I and Q analog output signals, respectively, to remove undesired signals caused by the prior digital-to-analog conversion. Amplifiers (AMP) 1316(1), 1316(2) amplify the signals from the lowpass filters 1314(1), 1314(2), respectively, and provide I and Q baseband signals. An upconverter 1318 upconverts the I and Q baseband signals with I and Q transmit (TX) local oscillator (LO) signals through mixers 1320(1), 1320(2) from a TX LO signal generator 1322 to provide an upconverted signal 1324. A filter 1326 filters the upconverted signal 1324 to remove undesired signals caused by the frequency upconversion as well as noise in a receive frequency band. A power amplifier (PA) 1328 amplifies the upconverted signal 1324 from the filter 1326 to obtain the desired output power level and provides a transmit RF signal. The transmit RF signal is routed through a duplexer or switch 1330 and transmitted via an antenna 1332.

In the receive path, the antenna 1332 receives signals transmitted by base stations and provides a received RF signal, which is routed through the duplexer or switch 1330 and provided to a low noise amplifier (LNA) 1334. The duplexer or switch 1330 is designed to operate with a specific receive (RX)-to-TX duplexer frequency separation, such that RX signals are isolated from TX signals. The received RF signal is amplified by the LNA 1334 and filtered by a filter 1336 to obtain a desired RF input signal. Down-conversion mixers 1338(1), 1338(2) mix the output of the filter 1336 with I and Q RX LO signals (i.e., LO_I and LO_Q) from an RX LO signal generator 1340 to generate I and Q baseband signals. The I and Q baseband signals are amplified by amplifiers (AMP) 1342(1), 1342(2) and further filtered by lowpass filters 1344(1), 1344(2) to obtain I and Q analog input signals, which are provided to the data processor 1306. In this example, the data processor 1306 includes ADCs 1346(1), 1346(2) for converting the analog input signals into digital signals to be further processed by the data processor 1306.

In the wireless communications device 1300 of FIG. 13, the TX LO signal generator 1322 generates the I and Q TX LO signals used for frequency upconversion, while the RX LO signal generator 1340 generates the I and Q RX LO signals used for frequency downconversion. Each LO signal is a periodic signal with a particular fundamental frequency. A TX phase-locked loop (PLL) circuit 1348 receives timing information from the data processor 1306 and generates a control signal used to adjust the frequency and/or phase of the TX LO signals from the TX LO signal generator 1322. Similarly, an RX PLL circuit 1350 receives timing information from the data processor 1306 and generates a control signal used to adjust the frequency and/or phase of the RX LO signals from the RX LO signal generator 1340.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A sensing circuit for sensing magnetic tunnel junction (MTJ) switching in a magneto-resistive random access memory (MRAM) bit cell in response to a write operation, comprising:
   a sense amplifier, comprising:
      a first voltage input configured to be coupled to a reference voltage;
      a second voltage input configured to be coupled to a write operation voltage; and
      a voltage output;
      the sense amplifier configured to generate an output voltage based on a difference between the reference voltage and the write operation voltage;
   at least one storage circuit coupled to the first voltage input and the second voltage input;
   a first voltage sensing circuit, comprising;
      a first control circuit coupled to the first voltage input, the first control circuit configured to couple a bit line to the at least one storage circuit to pre-charge the at least one storage circuit to a first reference voltage based on a supply voltage applied to the bit line in response to a first pre-charge signal indicating a pre-charge phase; and
      a second control circuit coupled to the second voltage input, the second control circuit configured to couple the second voltage input to the bit line to apply a first write operation voltage based on the supply voltage applied on the bit line to the second voltage input in response to a first write operation signal indicating a write operation phase in response to a first write operation to an MRAM bit cell of a first logic state; and a second voltage sensing circuit, comprising;
a third control circuit coupled to the first voltage input, the third control circuit configured to couple a source line to the at least one storage circuit to pre-charge the at least one storage circuit to a second reference voltage based on the supply voltage applied to the source line in response to a second pre-charge signal indicating a pre-charge phase; and a fourth control circuit coupled to the second voltage input, the fourth control circuit configured to couple the second voltage input to the source line to apply a second write operation voltage based on the supply voltage applied on the source line to the second voltage input in response to a second write operation signal indicating a write operation phase in response to a second write operation to the MRAM bit cell of a second logic state opposite the first logic state.

2. The sensing circuit of claim 1, wherein the at least one storage circuit is configured to couple the pre-charged reference voltage to the first voltage input as the reference voltage in response to the second pre-charge signal not indicating the pre-charge phase.

3. The sensing circuit of claim 1, wherein the at least one storage circuit comprises a first storage circuit and a second storage circuit,
the first voltage sensing circuit comprising the first storage circuit coupled to the first voltage input of the sense amplifier; and
the second voltage sensing circuit comprising the second storage circuit coupled to the second voltage input of the sense amplifier.

4. The sensing circuit of claim 1, wherein the at least one storage circuit comprises a common capacitor coupled to the first voltage input and the second voltage input of the sense amplifier.

5. The sensing circuit of claim 1, wherein:
the first control circuit is coupled to the bit line;
the second control circuit is coupled to the bit line;
the third control circuit is coupled to the source line; and
the fourth control circuit is coupled to the source line.

6. The sensing circuit of claim 1, wherein:
the first control circuit comprises a first transistor comprising a first gate node, a first node coupled to the bit line, and a second node coupled to the first voltage input,
the first transistor configured to couple the bit line to the at least one storage circuit to pre-charge the at least one storage circuit to the first reference voltage applied to the bit line in response to the first pre-charge signal indicating the pre-charge phase applied to the first gate node to activate the first transistor to couple the bit line coupled to the first node to the first voltage input coupled to the second node; and the third control circuit comprises a third transistor comprising a third gate node, a third node coupled to the bit line, and a fourth node coupled to the first voltage input;
the third transistor configured to couple the source line to the at least one storage circuit to pre-charge the at least one storage circuit to the second reference voltage applied to the source line in response to the second pre-charge signal indicating the pre-charge phase applied to the third gate node to activate the third transistor to couple the source line coupled to the third node to the first voltage input coupled to the fourth node.

7. The sensing circuit of claim 1, wherein:
the second control circuit comprises a second transistor comprising a second gate node, a first node coupled to the bit line, and a second node coupled to the second voltage input,
the second transistor configured to couple the second voltage input to the bit line in response to the first write operation signal indicating the write operation phase applied to the second gate node to activate the second transistor to couple the bit line coupled to the first node to the second voltage input coupled to the second node; and the fourth control circuit comprises a fourth transistor comprising a fourth gate node, a third node coupled to the source line, and a fourth node coupled to the second voltage input;
the fourth transistor configured to couple the second voltage input to the source line in response to the second write operation signal indicating the second write operation phase applied to the fourth gate node to activate the fourth transistor to couple the source line coupled to the third node to the second voltage input coupled to the fourth node.

8. The sensing circuit of claim 1, further comprising a first phase control circuit configured to:
generate the first pre-charge signal indicating the pre-charge phase; and
generate the first write operation signal indicating the write operation phase.

9. The sensing circuit of claim 1, wherein:
the first control circuit and the third control circuit are a same control circuit; and
the second control circuit and the fourth control circuit are a same control circuit.

10. The sensing circuit of claim 9, wherein:
the first voltage sensing circuit further comprises a bit line control circuit coupled to the bit line and the first control circuit, the bit line control circuit configured to couple the bit line to the first control circuit in response to a first write logic control signal; and
the first voltage sensing circuit further comprises a source line control circuit coupled to the source line and the second control circuit, the source line control circuit configured to couple the source line to the second control circuit in response to a second write logic control signal.

11. The sensing circuit of claim 10, wherein:
the first control circuit comprises a first transistor comprising a first gate node, a first node coupled to the bit line control circuit, and a second node coupled to the first voltage input;
the first transistor configured to couple the bit line control circuit to the at least one storage circuit to pre-charge the at least one storage circuit to a bit line voltage applied to the bit line in response to the first pre-charge signal indicating the pre-charge phase applied to the first gate node to activate the first transistor to couple the bit line control circuit coupled to the first node to the first voltage input coupled to the second node; and the third control circuit comprises a third transistor comprising a third gate node, a third node coupled to the source line control circuit, and a fourth node coupled to the first voltage input;

the third transistor configured to couple the source line control circuit to the at least one storage circuit to pre-charge the at least one storage circuit to a source line voltage applied to the source line in response to the second pre-charge signal indicating the pre-charge phase applied to the third gate node to activate the third transistor to couple the source line control circuit coupled to the third node to the first voltage input coupled to the fourth node.

12. The sensing circuit of claim 10, wherein:

the second control circuit comprises a second transistor comprising a second gate node, a first node coupled to the bit line control circuit, and a second node coupled to the second voltage input;

the second transistor configured to couple the second voltage input to the bit line control circuit in response to the first write operation signal indicating the write operation phase applied to the second gate node to activate the second transistor to couple the bit line control circuit coupled to the first node to the second voltage input coupled to the second node; and the fourth control circuit comprises a fourth transistor comprising a fourth gate node, a third node coupled to the source line control circuit, and a fourth node coupled to the second voltage input;

the fourth transistor configured to couple the second voltage input to the source line in response to the second write operation signal indicating the write operation phase applied to the fourth gate node to activate the fourth transistor to couple the source line control circuit coupled to the third node to the second voltage input coupled to the fourth node.

13. The sensing circuit of claim 10, further comprising a phase control circuit, comprising:

a first phase control input configured to be coupled to a word line coupled to the MRAM bit cell, the first phase control input configured to receive a word line signal from the word line in response to the first write operation to the MRAM bit cell;

a first phase control output; and a second phase control output;

the phase control circuit configured to generate the first pre-charge signal indicating the pre-charge phase on the first phase control output;

the phase control circuit further comprising a first delay circuit coupled to the first phase control output, the first delay circuit configured to delay the first pre-charge signal by a first delay to generate a first delayed pre-charge signal; and the phase control circuit further configured to generate the first write operation signal indicating the write operation phase on the second phase control output in response to the first delayed pre-charge signal.

14. The sensing circuit of claim 13, wherein the phase control circuit is further configured to:

receive the word line signal from the word line in response to the second write operation to the MRAM bit cell;

generate the second pre-charge signal indicating the pre-charge phase on the first phase control output; and generate the second write operation signal indicating the write operation phase on the second phase control output in response to the first delayed pre-charge signal.

15. The sensing circuit of claim 14, wherein the phase control circuit further comprises:

a first write operation control circuit configured to generate a first write logic control signal in response to the first write operation signal and the word line signal indicating a write operation on the word line; and a second write operation control circuit configured to generate a second write logic control signal in response to the second write operation signal and the word line signal indicating a write operation on the word line.

16. The sensing circuit of claim 1 integrated into an integrated circuit (IC).

17. The sensing circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

18. A sensing circuit for sensing magnetic tunnel junction (MTJ) switching in a magneto-resistive random access memory (MRAM) bit cell in response to a write operation, comprising:

a sensing means for generating an output voltage based on a difference between a reference voltage and a write operation voltage;

a storage means coupled to the sensing means;

a first sensing means for pre-charging the storage means to a first reference voltage based on a supply voltage applied to a bit line coupled to an MRAM bit cell in response to a first pre-charge signal indicating a pre-charge phase in response to a first write operation, and for discharging the first reference voltage stored in the storage means to the sensing means in response to the first pre-charge signal not indicating the pre-charge phase;

a second sensing means for coupling the sensing means to the bit line to apply a first write operation voltage on the bit line to the sensing means in response to a first write operation signal indicating a write operation phase in response to the first write operation to the MRAM bit cell of a first logic state;

a third sensing means for pre-charging the storage means to a second reference voltage based on a supply voltage applied to a source line coupled to the MRAM bit cell in response to a second pre-charge signal indicating a pre-charge phase in response to a second write operation, and for discharging the second reference voltage stored in the storage means to the sensing means in response to the second pre-charge signal not indicating the pre-charge phase; and a fourth sensing means for coupling the sensing means to the source line to apply a second write operation voltage on the source line to the sensing means in response to a second write operation signal indicating a write operation phase in response to the second write operation to the MRAM bit cell of a second logic state opposite the first logic state.

19. A method of sensing magnetic tunnel junction (MTJ) switching in a magneto-resistive random access memory (MRAM) bit cell in response to a write operation, comprising:
coupling a bit line to a first storage circuit, in response to a first pre-charge signal indicating a pre-charge phase, to pre-charge the first storage circuit to a first reference voltage based on a supply voltage applied to the bit line of an MRAM bit cell;
coupling the first reference voltage stored in the first storage circuit to a first voltage input coupled to a sense amplifier;
coupling a first write operation voltage on the bit line to a second voltage input coupled to the sense amplifier, in response to a first write operation signal indicating a write operation phase to switch a magnetic orientation of an MTJ of the MRAM bit cell to a first logic state for a first write operation;
sensing a difference in the first reference voltage at the first voltage input and the first write operation voltage at the second voltage input to detect switching of the magnetic orientation of the MTJ of the MRAM bit cell in response to the first write operation;
coupling a source line to a second storage circuit, in response to a second pre-charge signal indicating a pre-charge phase, to pre-charge the second storage circuit to a second reference voltage based on a supply voltage applied to the source line;
coupling the second reference voltage stored in the second storage circuit to the first voltage input coupled to the sense amplifier;
coupling a second write operation voltage on the source line to the second voltage input coupled to the sense amplifier, in response to a second write operation signal indicating a write operation phase to switch the magnetic orientation of the MTJ of the MRAM bit cell to a second logic state, opposite of the first logic state, for a second write operation; and
sensing a difference in the second reference voltage at the first voltage input and the second write operation voltage at the second voltage input to detect switching of the magnetic orientation of the MTJ of the MRAM bit cell in response to the second write operation.

20. The method of claim 19, further comprising:
generating the first pre-charge signal indicating the pre-charge phase of the first write operation to store the first logic state in the MRAM bit cell; and
generating the first write operation signal indicating the write operation phase of the first write operation to store the first logic state in the MRAM bit cell.

21. The method of claim 19, further comprising:
generating the second pre-charge signal indicating the pre-charge phase of the second write operation to store the second logic state in the MRAM bit cell; and
generating the second write operation signal indicating the write operation phase of the second write operation to store the second logic state in the MRAM bit cell.

22. The method of claim 19, further comprising not activating a first control circuit in response to the second pre-charge signal indicating the pre-charge phase to pre-charge the second storage circuit to the second reference voltage.

23. The method of claim 19, further comprising not activating a third control circuit in response to the first pre-charge signal indicating the pre-charge phase to pre-charge the first storage circuit to the first reference voltage.

24. The method of claim 19, further comprising not activating a fourth control circuit in response to the first write operation signal indicating the write operation phase.

25. The method of claim 19, further comprising not activating a second control circuit in response to the second write operation signal indicating the write operation phase.

26. The method of claim 19, wherein:
coupling the bit line to the first storage circuit comprises activating a first control circuit coupled to the MRAM bit cell and receiving the first reference voltage based on the supply voltage in response to the first write operation, to couple the bit line to the first storage circuit, in response to the first pre-charge signal indicating the pre-charge phase to pre-charge the first storage circuit to the first reference voltage applied to the bit line;
decoupling the bit line from the first storage circuit comprises deactivating a first control circuit to decouple the first reference voltage from the first storage circuit and discharging the first reference voltage in the first storage circuit to the first voltage input coupled to the sense amplifier, in response to the first pre-charge signal not indicating the pre-charge phase for the first write operation;
coupling the first write operation voltage on the bit line to the second voltage input comprises activating a second control circuit coupled to the bit line, to couple the first write operation voltage on the bit line to the second voltage input coupled to the sense amplifier, in response to the first write operation signal indicating the write operation phase to switch the magnetic orientation of the MTJ of the MRAM bit cell to the first logic state for the first write operation;
coupling the source line to a second storage circuit comprises activating a third control circuit coupled to the MRAM bit cell and receiving the second reference voltage based on the supply voltage in response to the second write operation, to couple the source line to the second storage circuit, in response to the second pre-charge signal indicating the pre-charge phase to pre-charge the second storage circuit to the second reference voltage applied to the source line;
decoupling the source line from the second storage circuit comprises deactivating the third control circuit to decouple the second reference voltage from the second storage circuit and discharging the second reference voltage in the second storage circuit to the first voltage input coupled to the sense amplifier, in response to the second pre-charge signal not indicating the pre-charge phase for the second write operation; and
coupling the second write operation voltage on the source line to the second voltage input comprises activating a fourth control circuit to couple the second write operation voltage on the source line to the second voltage input coupled to the sense amplifier, in response to the second write operation signal indicating the write operation phase to switch the magnetic orientation of the MTJ of the MRAM bit cell to the second logic state, opposite of the first logic state, for the second write operation.

27. The method of claim 26, wherein:
activating the first control circuit comprises activating the third control circuit coupled to the MRAM bit cell and receiving the second reference voltage based on the supply voltage in response to the second write operation, to couple the source line to the second storage circuit, in response to the second pre-charge signal indicating the pre-charge phase to pre-charge the second storage circuit to the second reference voltage applied to the source line;

deactivating the first control circuit comprises deactivating the third control circuit to decouple the second reference voltage from the second storage circuit and discharging the second reference voltage in the second storage circuit to the first voltage input coupled to the sense amplifier, in response to the second pre-charge signal not indicating the pre-charge phase for the second write operation; and activating the second control circuit comprises activating the fourth control circuit to couple the second write operation voltage on the source line to the second voltage input coupled to the sense amplifier, in response to the second write operation signal indicating the write operation phase to switch the magnetic orientation of the MTJ of the MRAM bit cell to the second logic state, opposite of the first logic state, for the second write operation.

28. The method of claim 19, further comprising:
generating the first pre-charge signal indicating the pre-charge phase in response to the first write operation;
delaying the first pre-charge signal by a first delay to generate a first delayed pre-charge signal; and
generating the first write operation signal indicating the write operation phase in response to the first delayed pre-charge signal.

29. The method of claim 28, further comprising:
generating the second pre-charge signal indicating the pre-charge phase in response to the second write operation;
delaying the second pre-charge signal by a second delay to generate a second delayed pre-charge signal; and
generating the second write operation signal indicating the write operation phase in response to the second delayed pre-charge signal.

30. The method of claim 19, wherein the first storage circuit and the second storage circuit comprise a same storage circuit.

31. A magneto-resistive random access memory (MRAM), comprising:
a plurality of MRAM bit cells, each comprising:
an access transistor comprising a gate node coupled to a word line, a first access node and a second access node coupled to a source line; and
a magnetic tunnel junction (MTJ) coupled between a bit line and the first access node of the access transistor; and
a plurality of sensing circuits each coupled to an MRAM bit cell among the plurality of MRAM bit cells and each comprising:
at least one storage circuit;
a first voltage sensing circuit, comprising:
a first control circuit coupled to a first voltage input, the first control circuit configured to couple a bit line to the at least one storage circuit to pre-charge the at least one storage circuit to a first reference voltage based on a supply voltage applied to the bit line in response to a first pre-charge signal indicating a pre-charge phase; and
a second control circuit coupled to a second voltage input, the second control circuit configured to couple the second voltage input to the bit line to apply a first write operation voltage based on the supply voltage applied on the bit line to the second voltage input in response to a first write operation signal indicating a write operation phase in response to a first write operation to the MRAM bit cell of a first logic state; and
a second voltage sensing circuit, comprising;
a third control circuit coupled to the first voltage input, the third control circuit configured to couple the source line to the at least one storage circuit to pre-charge the at least one storage circuit to a second reference voltage based on the supply voltage applied to the source line in response to a second pre-charge signal indicating a pre-charge phase; and
a fourth control circuit coupled to the second voltage input, the fourth control circuit configured to couple the second voltage input to the source line to apply a second write operation voltage based on the supply voltage applied to the source line to the second voltage input in response to a second write operation signal indicating a write operation phase in response to a second write operation to the MRAM bit cell of a second logic state opposite the first logic state.

32. The MRAM of claim 31, further comprising at least one first phase control circuit each comprising:
a first phase control input configured to be coupled to the word line coupled to at least one selected MRAM bit cell among the plurality of MRAM bit cells for the first write operation, the first phase control input configured to receive a word line signal from the word line in response to the first write operation to the at least one selected MRAM bit cell;
a first phase control output; and
a second phase control output;
the at least one first phase control circuit configured to generate the first pre-charge signal indicating the pre-charge phase on the first phase control output;
the at least one first phase control circuit further comprising a first delay circuit coupled to the first phase control output, and configured to delay the first pre-charge signal by a first delay to generate a first delayed pre-charge signal; and
the at least one first phase control circuit further configured to generate the first write operation signal indicating the write operation phase on the second phase control output in response to the first delayed pre-charge signal.

33. The MRAM of claim 32, further comprising at least one second phase control circuit each comprising:
a second phase control input configured to be coupled to the word line coupled to at least one selected MRAM bit cell among the plurality of MRAM bit cells for the second write operation, the second phase control input configured to receive the word line signal from the word line in response to the second write operation to the at least one selected MRAM bit cell;
the at least one second phase control circuit configured to generate the second pre-charge signal indicating the pre-charge phase on the first phase control output;
the at least one second phase control circuit further comprising a second delay circuit configured to delay the second pre-charge signal by a second delay to generate a second delayed pre-charge signal; and
the at least one second phase control circuit further configured to generate the second write operation signal indicating the write operation phase on the second phase control output in response to the first delayed pre-charge signal.

34. The MRAM of claim 31, further comprising:
a write driver circuit configured to:
- apply the first write operation voltage on the bit line comprising a positive voltage with reference to the source line associated with selected MRAM bit cells among the plurality of MRAM bit cells for the write operation in response to the write operation comprising the first logic state; and
- apply the second write operation voltage on the source line comprising a positive voltage with reference to the bit line associated with the selected MRAM bit cells for the write operation in response to the write operation comprising the second logic state opposite of the first logic state.

35. The MRAM of claim 31, further comprising a word line decoder circuit configured to assert a word line signal on the word line based on a memory address for the write operation to select MRAM bit cells among the plurality of MRAM bit cells associated with the word line.

36. The MRAM of claim 31, further comprising at least one sense amplifier each coupled to a first voltage sensing circuit of at least one sensing circuit and a second voltage sensing circuit of the at least one sensing circuit, the at least sense amplifier configured to generate an output voltage based on a difference between the reference voltage and the write operation voltage.

37. The MRAM of claim 31, wherein the at least one storage circuit is configured to couple the pre-charged reference voltage to the first voltage input as a reference voltage.

* * * * *